US007323712B2

(12) United States Patent
Kokubo et al.

(10) Patent No.: US 7,323,712 B2
(45) **Date of Patent: *Jan. 29, 2008**

(54) ANISOTROPICALLY CONDUCTIVE CONNECTOR AND PRODUCTION PROCESS THEREOF, AND PROBE MEMBER

(75) Inventors: Terukazu Kokubo, Tokyo (JP); Koji Seno, Tokyo (JP); Masaya Naoi, Tokyo (JP); Kazuo Inoue, Tokyo (JP)

(73) Assignee: JSR Corporation, Tokyo (JP)

( * ) Notice: Subject to any disclaimer, the term of this patent is extended or adjusted under 35 U.S.C. 154(b) by 197 days.

This patent is subject to a terminal disclaimer.

(21) Appl. No.: 11/205,174

(22) Filed: Aug. 17, 2005

(65) Prior Publication Data

US 2006/0033100 A1 Feb. 16, 2006

Related U.S. Application Data

(63) Continuation of application No. 10/470,746, filed as application No. PCT/JP02/00959 on Feb. 6, 2002, now Pat. No. 6,969,622.

(30) Foreign Application Priority Data

Feb. 9, 2001 (JP) ............................... 2001-33908

(51) Int. Cl.
*H01L 23/58* (2006.01)

(52) U.S. Cl. ......................................... 257/48; 324/765

(58) Field of Classification Search .................. 257/48; 324/765, 754

See application file for complete search history.

(56) References Cited

U.S. PATENT DOCUMENTS 6,168,442 B1 1/2001 Naoi
6,204,681 B1 3/2001 Nagatsuka et al.
6,215,321 B1 4/2001 Nakata
6,394,821 B1 5/2002 Matsumura et al.
6,597,192 B2 7/2003 Yamaguchi et al.

(Continued)

FOREIGN PATENT DOCUMENTS

EP 558855 A2 9/1993

(Continued)

OTHER PUBLICATIONS esp@cenet—English Abstract for JP11204177.

(Continued)

*Primary Examiner*—Tuan H. Nguyen
(74) *Attorney, Agent, or Firm*—Oblon, Spivak, McClelland, Maier & Neustadt, P.C.

(57) ABSTRACT

An anisotropically conductive connector, by which positioning, and holding and fixing to a wafer to be inspected can be conducted with ease even when the wafer has a large area, contains a frame plate having a plurality of anisotropically conductive film-arranging holes formed corresponding to regions of electrodes to be inspected of a wafer, and a plurality of elastic anisotropically conductive films arranged in the respective anisotropically conductive film-arranging holes and supported by the inner peripheral edge thereabout.

18 Claims, 12 Drawing Sheets

U.S. PATENT DOCUMENTS

| | | | | |
|---|---|---|---|---|
| 6,663,799 | B2 * | 12/2003 | Kokubo et al. | 252/512 |
| 6,690,564 | B1 | 2/2004 | Haruta et al. | |
| 6,720,787 | B2 | 4/2004 | Kimura et al. | |
| 2001/0049208 | A1 * | 12/2001 | Igarashi et al. | 439/68 |
| 2004/0028893 | A1 | 2/2004 | Inoue et al. | |
| 2004/0217342 | A1 | 11/2004 | Kokubo et al. | |
| 2006/0033100 | A1 | 2/2006 | Kokubo et al. | |

FOREIGN PATENT DOCUMENTS

| | | |
|---|---|---|
| JP | 11-204177 | 7/1999 |
| JP | 2000-353556 | 12/2000 |
| WO | 90/13992 | 11/1990 |
| WO | 02/065588 | 8/2002 |

OTHER PUBLICATIONS esp@cenet—English Abstract for JP2000353556.
esp@cenet—English Abstract of JP7231019.
esp@cenet—English Abstract of JP8005666.
U.S. Appl. No. 11/395,148, filed Apr. 3, 2006, Kokubo et al.
esp@cenet—English Abstract for JP11204177, 1999.
esp@cenet—English Abstract for JP20003535556, 2000.
esp@cenet—English Abstract of JP7231019, 1995.
esp@cenet—English Abstract of JP8005666, 1996.

* cited by examiner

ANISOTROPICALLY CONDUCTIVE CONNECTOR AND PRODUCTION PROCESS THEREOF, AND PROBE MEMBER

CROSS REFERENCE TO RELATED APPLICATIONS

This application is a continuation of U.S patent application Ser. No. 10/470,746, filed Aug. 11, 2003, now U.S. Pat. No. 6,969,622.

TECHNICAL FIELD

The present invention relates to an anisotropically conductive connector suitable for use in conducting electrical inspection of a plurality of integrated circuits formed on a wafer in a state of the wafer and a production process thereof, and a probe member having this anisotropically conductive connector, and more particularly to an anisotropically conductive connector suitable for use in conducting electrical inspection of integrated circuits having at least 5,000 electrodes to be inspected in total formed on a wafer having a diameter of, for example, 8 inches or greater in a state of the wafer and a production process thereof, and a probe member having this anisotropically conductive connector.

BACKGROUND ART

In the production process of semiconductor integrated circuit devices, after a great number of integrated circuits are formed on a wafer, a probe test for sorting defective integrated circuits is generally conducted by inspecting basic electrical properties of each of these integrated circuits. This wafer is then cut, thereby forming semiconductor chips. Such a semiconductor chip is contained and sealed in a proper package. Each of the packaged semiconductor integrated circuit devices is further subjected to a burn-in test that electrical properties thereof are inspected under a high-temperature environment, thereby sorting latently defective semiconductor integrated circuit devices.

In such electrical inspection of integrated circuits, such as probe test or burn-in test, a probe member is used for electrically connecting each of electrodes to be inspected in a wafer or integrated circuit device as an object of the inspection to a tester. As such a probe member, is known a member composed of a circuit board for inspection, on which inspection electrodes have been formed in accordance with a pattern corresponding to a pattern of electrodes to be inspected, and an anisotropically conductive elastomer sheet arranged on this circuit board for inspection.

As such anisotropically conductive elastomer sheets, there have heretofore been known those of various structures. For example, Japanese Patent Application Laid-Open No. 93393/1976 discloses an anisotropically conductive elastomer sheet (hereinafter referred to as "dispersion type anisotropically conductive elastomer sheet") obtained by uniformly dispersing metal particles in an elastomer, and Japanese Patent Application Laid-Open No. 147772/1978 discloses an anisotropically conductive elastomer sheet (hereinafter referred to as "uneven distribution type anisotropically conductive elastomer sheet") obtained by unevenly distributing particles of a conductive magnetic substance in an elastomer to form a great number of conductive parts extending in a thickness-wise direction thereof and insulating parts for mutually insulating them. Further, Japanese Patent Application Laid-Open No. 250906/1986 discloses an uneven distribution type anisotropically conductive elastomer sheet with a difference in level defined between the surface of each conductive part and an insulating part.

In the uneven distribution type anisotropically conductive elastomer sheet, the conductive parts are formed in accordance with a pattern corresponding to a pattern of electrodes to be inspected of an integrated circuit to be inspected, and so it has advantages compared with the dispersion type anisotropically conductive elastomer sheet in that electrical connection between electrodes can be achieved with high reliability even to an integrated circuit small in the arrangement pitch of electrodes to be inspected, i.e., center distance between adjacent electrodes to be inspected.

In such an uneven distribution type anisotropically conductive elastomer sheet, it is necessary to hold and fix it in a particular positional relation to a circuit board for inspection and an object for inspection in an operation of achieving an electrical connection to them.

However, the anisotropically conductive elastomer sheet is flexible and easy to be deformed, and so it is low in handling property. In addition, with the miniaturization or high-density wiring of electric products in recent years, integrated circuit devices used therein tend to arrange electrodes at a high density as the number of electrodes increases and the arrangement pitch of the electrodes becomes smaller. Therefore, the positioning and the holding and fixing of the uneven distribution type anisotropically conductive elastomer sheet are going to be difficult upon its electrical connection to electrodes to be inspected of the object for inspection.

In the burn-in test, there is a problem that even when the necessary positioning, and holding and fixing of the uneven distribution type anisotropically conductive elastomer sheet to an integrated circuit device has been realized once, positional deviation between conductive parts of the uneven distribution type anisotropically conductive elastomer sheet and electrodes to be inspected of the integrated circuit device occurs when they are subjected to thermal hysteresis by temperature change, since coefficient of thermal expansion is greatly different between a material (for example, silicon) making up the integrated circuit device as the object for inspection and a material (for example, silicone rubber) making up the uneven distribution type anisotropically conductive elastomer sheet, so that the state of electrical connection is changed, and the stable connection state is not retained.

In order to solve such a problem, an anisotropically conductive connector composed of a metal-made frame plate having an opening and an anisotropically conductive elastomer sheet arranged in the opening of this frame plate and supported at its peripheral edge by an opening inner edge of the frame plate has been proposed (Japanese Patent Application Laid-Open No. 40224/1999).

This anisotropically conductive elastomer connector is generally produced in the following manner.

As illustrated in FIG. 20, a mold for molding an anisotropically conductive elastomer sheet composed of a top force 80 and a bottom force 85 making a pair therewith is provided, a frame plate 90 having an opening 91 is arranged in alignment in this mold, and a molding material in which conductive particles exhibiting magnetism are dispersed in a polymeric substance-forming material, which will become an elastic polymeric substance by a curing treatment, is fed into a region including the opening 91 of the frame plate 90 and an opening edge thereof to form a molding material layer 95. Here, the conductive particles P contained in the molding material layer 95 are in a state dispersed in the molding material layer 95.

Both top force 80 and bottom force 85 in the mold respectively have molding surfaces composed of a plurality of ferromagnetic substance layers 81 or 86 formed in accordance with a pattern corresponding to a pattern of conductive parts of an anisotropically conductive elastomer sheet to be molded and non-magnetic substance layers 82 or 87 formed at other portions than the portions at which the ferromagnetic substance layers 81 or 86 have been formed, and the corresponding ferromagnetic substance layers 81 and 86 are arranged in opposed relation to each other.

A pair of electromagnets, for example, are then arranged on the upper surface of the top force 80 and the lower surface of the bottom force 85, and the electromagnets are operated, thereby applying a magnetic field having higher intensity at portions between ferromagnetic substance layers 81 of the top force 80 and their corresponding ferromagnetic substance layers 86 of the bottom force 85, i.e., portions to become conductive parts, than the other portions, to the molding material layer 95 in the thickness-wise direction thereof. As a result, the conductive particles P dispersed in the molding material layer 95 are gathered at the portions where the magnetic field having the higher intensity is applied, i.e., the portions between ferromagnetic substance layers 81 of the top force 80 and their corresponding ferromagnetic substance layers 86 of the bottom force 85, and at the same time oriented so as to align in the thickness-wise direction of the molding material layer. In this state, the molding material layer 95 is subjected to a curing treatment, whereby an anisotropically conductive elastomer sheet comprising a plurality of conductive parts, in which the conductive particles P are contained in a state oriented so as to align in the thickness-wise direction, and insulating parts for mutually insulating these conductive parts is molded in a state that its peripheral edge has been supported by the opening edge of the frame plate, thereby producing an anisotropically conductive connector.

According to such an anisotropically conductive connector, it is hard to be deformed and easy to handle because the anisotropically conductive elastomer sheet is supported by the metal-made frame plate, and the positioning and the holding and fixing to an integrated circuit device can be easily conducted upon an operation of achieving an electrical connection to the integrated circuit device because a positioning mark (for example, a hole) is formed in the frame plate. In addition, a material low in coefficient of thermal expansion is used as a material for forming the frame plate, whereby the thermal expansion of the anisotropically conductive elastomer sheet is restrained by the frame plate, so that positional deviation between the conductive parts of the uneven distribution type anisotropically conductive elastomer sheet and electrodes to be inspected of the integrated circuit device is prevented even when they are subjected to thermal hysteresis by temperature change. As a result, a good electrically connected state can be stably retained.

By the way, in a probe test conducted to integrated circuits formed on a wafer, a method, in which a probe test is collectively performed on an integrated circuit group composed, for example, of 16 or 32 integrated circuits among a great number of integrated circuits formed on a wafer, and the probe test is successively performed on other integrated circuit groups, has heretofore been adopted.

In recent years, there has been a demand for collectively performing a probe test on, for example, 64 or 124, or all of integrated circuits among a great number of integrated circuits formed on a wafer for the purpose of improving inspection efficiency and reducing inspection cost.

In the burn-in test on the other hand, it takes a long time to individually conduct electrical inspection of a great number of integrated circuit devices because each integrated circuit device that is an object for inspection is minute, and its handling is inconvenient, whereby inspection cost becomes considerably high. From such reasons, there has been proposed a WLBI (Wafer Level Burn-in) test in which the burn-in test is collectively performed on a great number of integrated circuits formed on a wafer in the state of the wafer.

However, it has been found that when a wafer as an object for inspection is of large size of, for example, at least 8 inches in diameter, and the number of electrodes to be inspected formed thereon is, for example, at least 5,000, particularly at least 10,000, it is difficult to apply the above-described anisotropically conductive connector as a probe member for the probe test or WLBI test for the following reasons because a pitch between electrodes to be inspected in each integrated circuit is extremely small.

When a magnetic field is applied in the thickness-wise direction of the molding material layer 95 in the molding step of the anisotropically conductive elastomer sheet, conductive particles P present at a portion located inside among portions, which will become conductive parts in the molding material layer 95, for example, a portion (hereinafter referred to as "conductive part-forming portion X") represented by a character X in FIG. 20, and surroundings thereof are gathered at the conductive part-forming portion X. However, not only conductive particles P present at a portion located most outside among the portions, which will become conductive parts, for example, a portion (hereinafter referred to as "conductive part-forming portion Y") represented by a character Y in FIG. 20, and surroundings thereof, but also conductive particles P present above and below the frame plate 90 are gathered at the conductive part-forming portion Y. As a result, a conductive part formed at the conductive part-forming portion Y is in a state that the conductive particles P have been contained in excess, so that its insulating property with an adjacent conductive part or frame plate is not achieved, and so these conductive parts cannot be effectively used. In order to prevent the conductive particles P from being excessively contained in the conductive part formed at the conductive part-forming portion Y, it is also considered to reduce the content of the conductive particles in the molding material. However, the content of the conductive particles in any other conductive part, for example, the conductive part formed at the conductive part-forming portion X becomes too low, so that good conductivity cannot be achieved at such conductive parts.

In order to inspect a wafer having a diameter of, for example, 8 inches (about 20 cm), it is necessary to use an anisotropically conductive connector, whose anisotropically conductive elastomer sheet has a diameter of about 8 inches. However, such an anisotropically conductive elastomer sheet is large in the whole area but each conductive part is minute, and the area proportion of the surfaces of the conductive parts to the whole surface of the anisotropically conductive elastomer sheet is low. It is therefore extremely difficult to surely produce such an anisotropically conductive elastomer sheet. Accordingly, yield is extremely lowered in the production of the anisotropically conductive elastomer sheet. As a result, the production cost of the anisotropically conductive elastomer sheet is increased, and in turn, the inspection cost is increased.

The coefficient of linear thermal expansion of a material making up the wafer, for example, silicon is about $3.3\times10^{-6}$/K. On the other hand, the coefficient of linear thermal expansion of a material making up the anisotropically conductive elastomer sheet, for example, silicone rubber is about $2.2\times10^{-4}$/K. Accordingly, when a wafer and an anisotropically conductive elastomer sheet each having a diameter of 20 cm at 25° C. are heated from 20° C. to 120° C., a change of the diameter of the wafer is only 0.0066 cm in theory, but a change of the diameter of the anisotropically conductive elastomer sheet amounts to 0.44 cm.

When a great difference is created in the absolute quantity of thermal expansion in a plane direction as described above between the wafer and the anisotropically conductive elastomer sheet, it is extremely difficult to prevent positional deviation between electrodes to be inspected in the wafer and the conductive parts in the anisotropically conductive elastomer sheet upon the WLBI test even when the peripheral edge about the anisotropically conductive elastomer sheet is fixed by a frame plate having a coefficient of linear thermal expansion equivalent to that of the wafer.

As probe members for the WLBI test, are known those in which an anisotropically conductive elastomer sheet is fixed on a circuit board for inspection composed of, for example, a ceramic having a coefficient of linear thermal expansion equivalent to that of the wafer (see, for example, Japanese Patent Application Laid-Open Nos. 231019/1995 and 5666/1996, etc.). In such a probe member, as means for fixing the anisotropically conductive elastomer sheet to the circuit board for inspection, are considered a means of mechanically fixing peripheral portions about the anisotropically conductive elastomer sheet by, for example, screws or the like, a means of fixing it with an adhesive or the like, and the like.

However, in the means that the peripheral portions about the anisotropically conductive elastomer sheet are mechanically fixed by the screws or the like, it is extremely difficult to prevent positional deviation between electrodes to be inspected in the wafer and the conductive parts in the anisotropically conductive elastomer sheet for the same reasons of the means of being fixed by the frame plate as described above.

On the other hand, in the means of being fixed with the adhesive, it is necessary to apply the adhesive only to the insulating parts in the anisotropically conductive elastomer sheet in order to surely achieve electrical connection to the circuit board for inspection. However, since the anisotropically conductive elastomer sheet used in the WLBI test is small in the arrangement pitch of the conductive parts, and a clearance between adjacent conductive parts is small, it is extremely difficult in fact to do so. In the means of being fixed with the adhesive also, it is impossible to replace only the anisotropically conductive elastomer sheet by a new one when the anisotropically conductive elastomer sheet suffers from trouble, and so it is necessary to replace the whole probe member including the circuit board for inspection. As a result, increase in inspection cost is incurred.

In addition, as means for pressing the probe member against the object for inspection in the probe test or burn-in test, there have heretofore been used means by a load system that a load is applied to the probe member by a suitable pressing mechanism to pressurize the probe member. In order to electrically connect the probe member to the object for inspection stably and surely, it is necessary to apply a load of, for example, about 5 g per an electrode to be inspected.

When the object for inspection is a wafer having, for example, about 10,000 electrodes to be inspected, however, a load of at least 50 kg must be applied to the whole probe member. Therefore, a large-sized pressing mechanism is required, so that the inspection apparatus as a whole becomes considerably large.

Further, in the case a large-area wafer having a diameter of 8 inches or greater is inspected, scattering of loads applied to individual electrodes to be inspected occurs because difficulty is encountered on application of a load evenly to the whole wafer, so that it is difficult to achieve stable electrical connection to all the electrodes to be inspected.

In order to solve such problems, means utilizing a pressure reducing system have been proposed as means for pressing the probe member against the object for inspection (see Japanese Patent Application Laid-Open No. 5666/1996). The pressing means by this pressure reducing system are such that a water as an object for inspection is arranged in a box-type chamber opened at the top thereof, a probe member is arranged through an O-ring on the chamber so as to air-tightly close the opening of the chamber, and air within the chamber is evacuated to reduce the pressure in the interior of the chamber, thereby pressurizing the probe member by the atmospheric pressure.

According to the pressing means by such pressure reducing system, the inspection apparatus can be miniaturized because any large-sized pressing mechanism is not required, and moreover the whole wafer can be pressed by even force.

However, the pressing means by such pressure reducing system involves a problem that when air remains between an anisotropically conductive elastomer sheet in the probe member and a circuit board for inspection at the time the air within the chamber has been evacuated, both anisotropically conductive elastomer sheet and circuit board for inspection do not fully come into close contact with each other, so that stable electrical connection is not achieved.

DISCLOSURE OF THE INVENTION

The present invention has been made on the basis of the foregoing circumstances and has as its first object the provision of an anisotropically conductive connector suitable for use in conducting electrical inspection of a plurality of integrated circuits formed on a wafer as an object for inspection in a state of the wafer, by which positioning, and holding and fixing to the wafer can be conducted with ease even when the wafer has a large area of, for example, about 8 inches or greater in diameter, and the pitch of electrodes to be inspected in the integrated circuits formed is small, and moreover good conductivity can be achieved with certainty as to all conductive parts for connection, and insulating property between adjacent conductive parts can be achieved with certainty, and a production process thereof.

A second object of the present invention is to provide an anisotropically conductive connector that a good electrically connected state is stably retained even with environmental changes such as thermal hysteresis by temperature change, in addition to the above object.

A third object of the present invention is to provide a probe member by which positioning, and holding and fixing to a circuit device as an object for inspection can be conducted with ease even when the pitch of electrodes to be inspected in the circuit device is small, and which has high reliability on connection to each electrode to be inspected.

According to the present invention, there is thus provided an anisotropically conductive connector suitable for use in conducting electrical inspection of each of a plurality of integrated circuits formed on a wafer in a state of the wafer, which comprises:

a frame plate in which a plurality of anisotropically conductive film-arranging holes each extending in a thickness-wise direction of the frame plate are formed corresponding to electrode regions, in which electrodes to be inspected of the integrated circuits in the wafer as an object for inspection have been formed, and a plurality of elastic anisotropically conductive films arranged in the respective anisotropically conductive film-arranging holes in this frame plate and each supported by the inner peripheral edge about the anisotropically conductive film-arranging hole, wherein each of the elastic anisotropically conductive films is composed of a functional part composed of a plurality of conductive parts for connection each containing conductive particles exhibiting magnetism at high density and extending in the thickness-wise direction of the film and arranged correspondingly to the electrodes to be inspected of the integrated circuits in the wafer as an object for inspection, and insulating part insulating these conductive parts for connection mutually, and supported part integrally formed at a peripheral edge of the functional part and fixed to the inner peripheral edge about the anisotropically conductive film-arranging hole in this frame plate, and the supported part contains the conductive particles exhibiting magnetism.

In the anisotropically conductive connector according to the present invention, the frame plate may preferably have a saturation magnetization of at least 0.1 $Wb/m^2$ at least at the inner peripheral edges about the anisotropically conductive film-arranging holes thereof.

In such an anisotropically conductive connector, the whole of the frame plate may be formed by a magnetic substance having a saturation magnetization of at least 0.1 $Wb/m^2$.

The term "saturation magnetization" as used in the present invention means that measured under an environment of 20° C.

In the anisotropically conductive connector according to the present invention, positioning holes each extending through in the thickness-wise direction of the frame plate may preferably be formed in the frame plate.

In the anisotropically conductive connector according to the present invention, air circulating holes each extending through in the thickness-wise direction of the frame plate may preferably be formed in the frame plate.

In the anisotropically conductive connector according to the present invention, the coefficient of linear thermal expansion of the frame plate may preferably be at most $3\times10^{-5}$/K.

Such an anisotropically conductive connector may be used suitably in a burn-in test.

In the anisotropically conductive connector according to the present invention, it may be preferable that conductive parts for non-connection that are not electrically connected to any electrode to be inspected of the integrated circuits in the wafer as the object for inspection and extend in the thickness-wise direction be formed in the functional part of each of the elastic anisotropically conductive films in addition to the conductive parts for connection, and the conductive parts for non-connection contain the conductive particles exhibiting magnetism at high density and be mutually insulated from the conductive parts for connection by the insulating part.

According to the present invention, there is also provided a process for producing the anisotropically conductive connector described above, which comprises the steps of:

providing the frame plate in which a plurality of the anisotropically conductive film-arranging holes each extending in the thickness-wise direction of the frame plate are formed corresponding to the electrode regions, in which the electrodes to be inspected of the integrated circuits in the wafer as the object for inspection have been formed, forming molding material layers for elastic anisotropically conductive films in which the conductive particles exhibiting magnetism are dispersed in a liquid polymer-forming material, which will become an elastic polymeric substance by a curing treatment, in the respective anisotropically conductive film-arranging holes of the frame plate and at inner peripheries thereabout, and applying to the molding material layers a magnetic field having higher intensity at portions to become conductive parts for connection and portions to become supported parts than the other portions, thereby gathering the conductive particles in the molding material layers at the portions to become the conductive parts for connection in a state that at least the conductive particles existing in the portions to become the supported parts in the molding material layer are retained in these portions, and orienting the conductive particles in the thickness-wise direction, and in this state, subjecting the molding material layers to a curing treatment to form the elastic anisotropically conductive films.

In such production process of the anisotropically conductive connector, the molding material layers may preferably be formed in the respective anisotropically conductive film-arranging holes of the frame plate and at inner peripheries thereabout by:

providing a mold composed of a top force and a bottom force, on which ferromagnetic substance layers have been respectively formed in accordance with a pattern corresponding to a pattern of the conductive parts for connection in the elastic anisotropically conductive films to be formed, coating molding surfaces of one or both of the top force and bottom force of the mold by screen printing with a molding material in which the conductive particles exhibiting magnetism are dispersed in the liquid polymer-forming material, which will become the elastic polymeric substance by the curing treatment, and superimposing the top force and bottom force on each other through the frame plate.

According to the present invention, there is further provided a process for producing the anisotropically conductive connector described above, which comprises the steps of:

providing the frame plate in which a plurality of the anisotropically conductive film-arranging holes each extending in the thickness-wise direction of the frame plate are formed corresponding to the electrode regions, in which the electrodes to be inspected of the integrated circuits in the wafer as the object for inspection have been formed, arranging a spacer, in which through-holes each having a shape conforming to the plane shape of each elastic anisotropically conductive film to be formed and extending in the thickness-wise direction of the frame plate are formed corresponding to the said elastic anisotropically conductive films, on one surface or both surfaces of the frame plate, and forming molding material layers for elastic anisotropically conductive films in which the conductive particles exhibiting magnetism are dispersed in a liquid polymer-forming material, which will become an elastic polymeric substance by a curing treatment, in the anisotropically conductive film-arranging holes of the frame plate and the through-holes of the spacer, and applying to the molding material layers a magnetic field having higher intensity at portions to become conductive parts for connection and portions to become supported parts than the other portions, thereby gathering the conductive particles in the molding material layers at the portions to become the conductive parts for connection in a state that at least the conductive particles existing in the portions to become the supported parts in the molding material layer are retained in these portions, and orienting the conductive particles in the thickness-wise direction, and in this state, subjecting the molding material layers to a curing treatment to form the elastic anisotropically conductive films.

In such production process of the anisotropically conductive connector, the molding material layers may preferably be formed in the anisotropically conductive film-arranging holes of the frame plate and the through-holes of the spacer by:

providing a mold composed of a top force and a bottom force, on which ferromagnetic substance layers have been respectively formed in accordance with a pattern corresponding to a pattern of the conductive parts for connection in the elastic anisotropically conductive films to be formed, coating molding surfaces of one or both of the top force and bottom force of the mold by screen printing with a molding material in which the conductive particles exhibiting magnetism are dispersed in the liquid polymer-forming material, which will become the elastic polymeric substance by the curing treatment, and superimposing the top force and bottom force on each other through the frame plate and the spacer arranged on one surface or both surfaces of the frame plate.

According to the present invention, there is still further provided a process for producing the above-described anisotropically conductive connector having the conductive parts for non-connection, which comprises the steps of:

providing the frame plate in which a plurality of the anisotropically conductive film-arranging holes each extending in the thickness-wise direction of the frame plate are formed corresponding to the electrode regions, in which the electrodes to be inspected of the integrated circuits in the wafer as an object for inspection have been formed, forming molding material layers for elastic anisotropically conductive films in which the conductive particles exhibiting magnetism are dispersed in a liquid polymer-forming material, which will become an elastic polymeric substance by a curing treatment, in the respective anisotropically conductive film-arranging holes of the frame plate and at inner peripheries thereabout, applying to the molding material layers a magnetic field having higher intensity at portions to become conductive parts for connection, portions to become conductive parts for non-connection and portions to become supported parts than the other portions, thereby gathering the conductive particles in the molding material layers at the portions to become the conductive parts for connection and the portions to become the conductive parts for non-connection in a state that at least the conductive particles existing in the portions to become the supported parts in the molding material layer are retained in these portions, and orienting the conductive particles in the thickness-wise direction, and in this state, subjecting the molding material layers to a curing treatment to form the elastic anisotropically conductive films.

In such production process of the anisotropically conductive connector, the molding material layers may preferably be formed in the respective anisotropically conductive film-arranging holes of the frame plate and at inner peripheries thereabout by:

providing a mold composed of a top force and a bottom force, on which ferromagnetic substance layers have been respectively formed in accordance with patterns corresponding to patterns of the conductive parts for connection and the conductive parts for non-connection in the elastic anisotropically conductive films to be formed, and coating molding surfaces of one or both of the top force and bottom force of the mold by screen printing with a molding material in which the conductive particles exhibiting magnetism are dispersed in the liquid polymer-forming material, which will become the elastic polymeric substance by the curing treatment, and superimposing the top force and bottom force on each other through the frame plate.

According to the present invention, there is yet still further provided a process for producing the above-described anisotropically conductive connector having the conductive parts for non-connection, which comprises the steps of:

providing the frame plate in which a plurality of the anisotropically conductive film-arranging holes each extending in the thickness-wise direction of the frame plate are formed corresponding to the electrode regions, in which the electrodes to be inspected of the integrated circuits in the wafer as the object for inspection have been formed, arranging a spacer, in which through-holes each having a shape conforming to the plane shape of each elastic anisotropically conductive film to be formed and extending in the thickness-wise direction of the frame plate are formed corresponding to the said elastic anisotropically conductive films, on one surface or both surfaces of the frame plate, and forming molding material layers for elastic anisotropically conductive films in which the conductive particles exhibiting magnetism are dispersed in a liquid polymer-forming material, which will become an elastic polymeric substance by a curing treatment, in the anisotropically conductive film-arranging holes of the frame plate and the through-holes of the spacer, applying to the molding material layers a magnetic field having higher intensity at portions to become conductive parts for connection, portions to become conductive parts for non-connection and portions to become supported parts than the other portions, thereby gathering the conductive particles in the molding material layers at the portions to become the conductive parts for connection and the portions to become the conductive parts for non-connection in a state that at least the conductive particles existing in the portions to become the supported parts in the molding material layer are retained in these portions, and orienting the conductive particles in the thickness-wise direction, and in this state, subjecting the molding material layers to a curing treatment to form the elastic anisotropically conductive films.

In such production process of the anisotropically conductive connector, the molding material layers may preferably be formed in the anisotropically conductive film-arranging holes of the frame plate and the through-holes of the spacer by:

providing a mold composed of a top force and a bottom force, on which ferromagnetic substance layers have been respectively formed in accordance with patterns corresponding to patterns of the conductive parts for connection and the conductive parts for non-connection in the elastic anisotropically conductive films to be formed, and coating molding surfaces of one or both of the top force and bottom force of the mold by screen printing with a molding material in which the conductive particles exhibiting magnetism are dispersed in the liquid polymer-forming material, which will become the elastic polymeric substance by the curing treatment, and superimposing the top force and bottom force on each other through the frame plate and the spacer arranged on one surface or both surfaces of the frame plate.

According to the present invention, there is yet still further provided a probe member being used in conducting electrical inspection of each of a plurality of integrated circuits formed on a wafer in a state of the wafer, which comprises:

a circuit board for inspection, on the surface of which inspection electrodes are formed in accordance with a pattern corresponding to a pattern of electrodes to be inspected of the integrated circuits in the wafer as an object for inspection, and the above-described anisotropically conductive connector arranged on the surface of the circuit board for inspection.

In the probe member according to the present invention, it may be preferable that the coefficient of linear thermal expansion of the frame plate be at most $3\times10^{-5}$/K, and the coefficient of linear thermal expansion of a base material making up the circuit board for inspection be at most $3\times10^{-5}$/K.

In the probe member according to the present invention, a sheet-like connector may be arranged on the anisotropically conductive connector, the sheet-like connector being composed of an insulating sheet and a plurality of electrode structures each extending in a thickness-wise direction of the insulating sheet and arranged in accordance with a pattern corresponding to the pattern of the electrodes to be inspected.

Since the anisotropically conductive connectors described above are obtained by subjecting the molding material layers to a curing treatment in a state that the conductive particles have been retained in the portions to become the supported parts in the molding material layers by applying a magnetic field to those portions, the conductive particles existing in the portions to become the supported parts in the molding material layers, i.e., portions located above and below the peripheries about the anisotropically conductive film-arranging holes in the frame plate are not gathered at the portions to become conductive parts for connection, so that the conductive particles are prevented from being contained in excess in the conductive parts for connection, particularly, conductive parts for connection located most outside in the resulting elastic anisotropically conductive films. Accordingly, there is no need of reducing the content of the conductive particles in the molding material layers, so that good conductivity is achieved with certainty in all the conductive parts for connection in the elastic anisotropically conductive films, and moreover satisfactory insulating property between adjacent conductive parts for connection and between the frame plate and conductive parts for connection adjacent thereto can be achieved with certainty.

Since each of the anisotropically conductive film-arranging holes in the frame plate is formed corresponding to an electrode region in which electrodes to be inspected of integrated circuits in a wafer as an object for inspection have been formed, and the elastic anisotropically conductive film arranged in the each of the anisotropically conductive film-arranging hole may be small in area, the individual elastic anisotropically conductive films are easy to be formed. In addition, since the elastic anisotropically conductive film small in area is little in the absolute quantity of thermal expansion in a plane direction of the elastic anisotropically conductive film even when it is subjected to thermal hysteresis, the thermal expansion of the elastic anisotropically conductive film in the plane direction is surely restrained by the frame plate by using a material having a low coefficient of linear thermal expansion as that for forming the frame plate. Accordingly, a good electrically connected state can be stably retained even when the WLBI test is performed on a large-area wafer.

The positioning holes are formed in the frame plate, whereby positioning to the wafer as the object for inspection or the circuit board for inspection can be easily conducted.

The air circulating holes are formed in the frame plate, whereby air existing between the anisotropically conductive connector and the circuit board for inspection is discharged through the air circulating holes of the frame plate at the time the pressure within a chamber is reduced, when the pressure reducing system is utilized as the means for pressing the probe member in an inspection apparatus for wafer, thereby being able to surely bring the anisotropically conductive connector into close contact with the circuit board for inspection, so that necessary electrical connection can be achieved with certainty.

DESCRIPTION OF CHARACTERS

1 Probe member, 2 Anisotropically conductive connector,
3 Pressing plate, 4 Wafer mounting table,
5 Heater, 6 Wafer, 7 Electrodes to be inspected,
10 Frame plate,
11 Anisotropically conductive film-arranging holes,
15 Air circulating holes, 16 Positioning holes,
20 Elastic anisotropically conductive films, Molding material layers, 21 Functional parts,
22 Conductive parts for connection,
23 Insulating parts, 24 Projected parts,
25 Supported parts,
26 Conductive parts for non-connection,
27 Projected parts,
30 Circuit board for inspection,
31 Inspection electrodes,
41 Insulating sheet, 40 Sheet-like connector,
42 Electrode structures, 43 Front-surface electrode parts,
44 Back-surface electrode parts, 45 Short-circuit parts,
50 Chamber, 51 Evacuation pipe, 55 O-rings,
60 Mold, 61 Top force, 62 Base plate,
63 Ferromagnetic substance layers,
64 Non-magnetic substance layers, 64*a* Recesses,
65 Bottom force, 66 Base plate,
67 Ferromagnetic substance layers,
68 Non-magnetic substance layers, 68*a* Recesses,
69*a*, 69*b* Spacers,
80 Top force, 81 Ferromagnetic substance layers,
82 Non-magnetic substance layers,
85 Bottom force, 86 Ferromagnetic substance layers,
87 Non-magnetic substance layers,
90 Frame plate, 91 Opening, 95 Molding material layer
P Conductive particles.

BEST MODE FOR CARRYING OUT THE INVENTION

The embodiments of the present invention will hereinafter be described in details.

[Anisotropically Conductive Connector]

Figure 1:
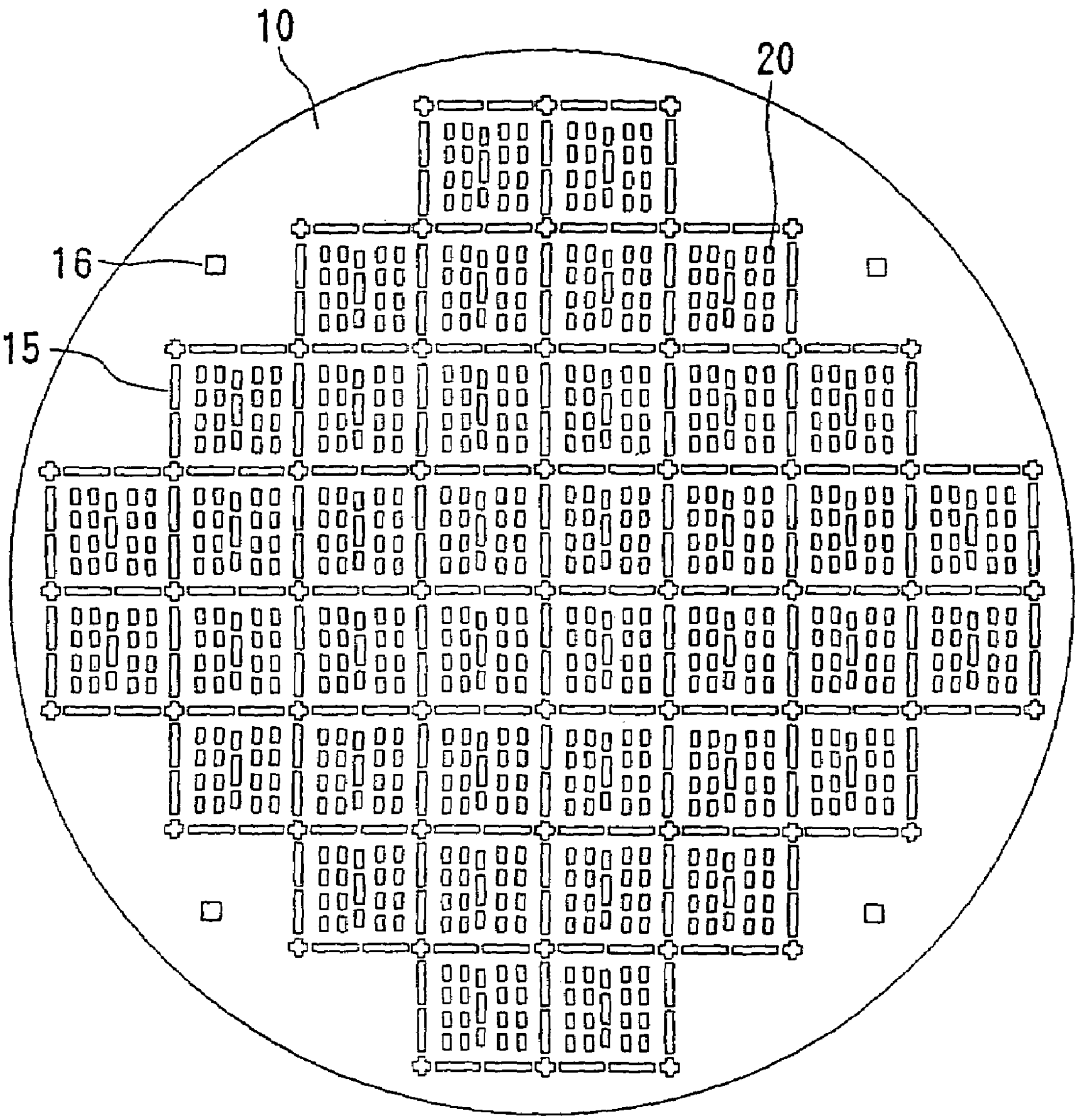
FIG. 1 is a plan view illustrating an exemplary anisotropically conductive connector according to the present invention.
Figure 2:
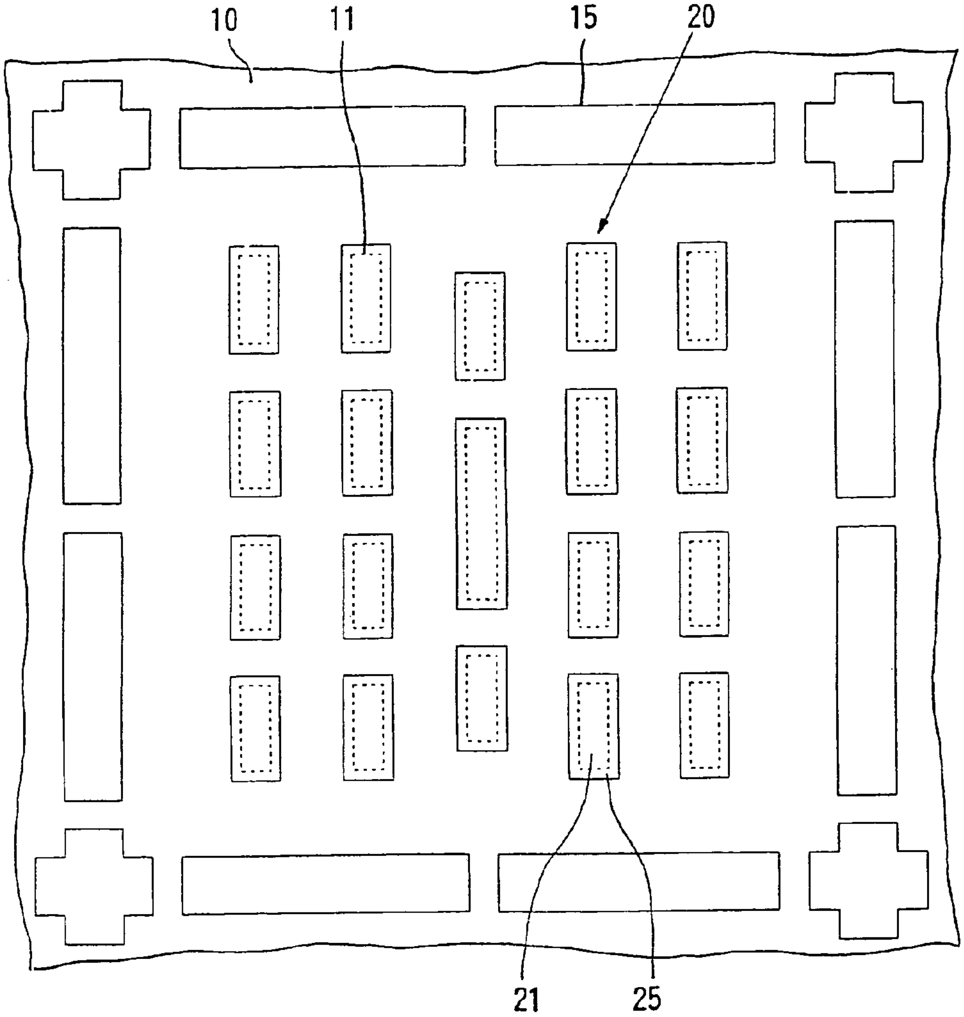
FIG. 2 is a plan view illustrating, on an enlarged scale, a part of the anisotropically conductive connector shown in FIG. 1.
Figure 3:
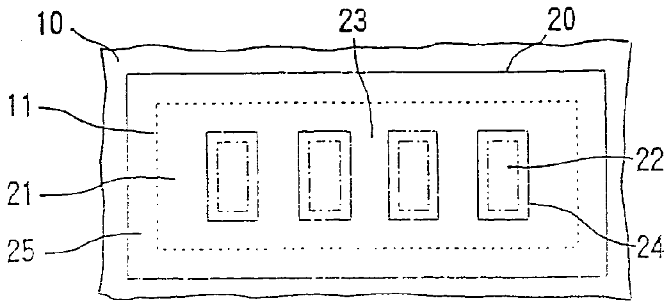
FIG. 3 is a plan view illustrating, on an enlarged scale, an elastic anisotropically conductive film in the anisotropically conductive connector shown in FIG. 1.
Figure 4:
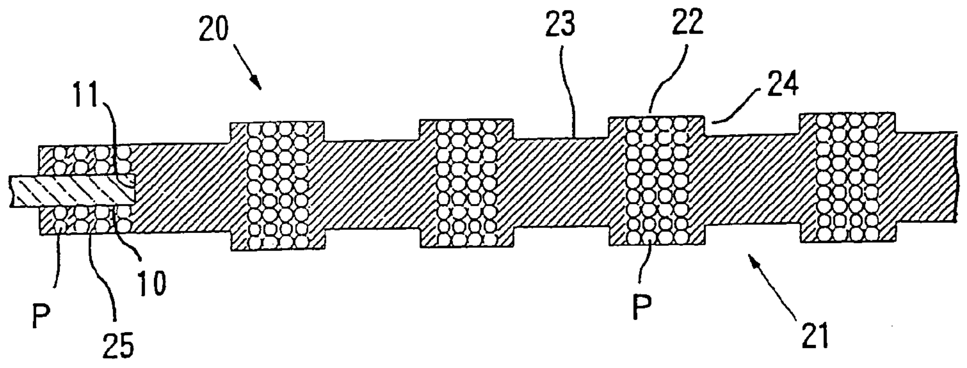
FIG. 4 is a cross-sectional view illustrating, on an enlarged scale, the elastic anisotropically conductive film in the anisotropically conductive connector shown in FIG. 1.

FIG. 1 is a plan view illustrating an exemplary anisotropically conductive connector according to the present invention, FIG. 2 is a plan view illustrating, on an enlarged scale, a part of the anisotropically conductive connector shown in FIG. 1, FIG. 3 is a plan view illustrating, on an enlarged scale, an elastic anisotropically conductive film in the anisotropically conductive connector shown in FIG. 1, and FIG. 4 is a cross-sectional view illustrating, on an enlarged scale, the elastic anisotropically conductive film in the anisotropically conductive connector shown in FIG. 1.

The anisotropically conductive connector shown in FIG. 1 is that used in conducting electrical inspection of each of, for example, a plurality of integrated circuits formed on a wafer in a state of the wafer and has a frame plate 10 in which a plurality of anisotropically conductive film-arranging holes 11 (indicated by broken lines) each extending through in the thickness-wise direction of the frame plate have been formed as illustrated in FIG. 2. The anisotropically conductive film-arranging holes 11 in this frame plate 10 are formed in accordance with a pattern of electrode regions in which electrodes to be inspected of the integrated circuits in the wafer as an object for inspection have been formed. Elastic anisotropically conductive films 20 having conductivity in the thickness-wise direction are arranged in the respective anisotropically conductive film-arranging holes 11 in this frame plate 10 in a state each supported by the inner peripheral edge about the anisotropically conductive film-arranging hole 11 of the frame plate 10 and in a state mutually independent of adjacent anisotropically conductive films 20. In the frame plate 10 of this embodiment are formed air circulating holes 15 for circulating air between the anisotropically conductive connector and a member adjacent thereto when a pressing means of a pressure reducing system is used in an inspection apparatus for wafer, which will be described subsequently. In addition, positioning holes 16 for positioning to the wafer as the object for inspection and a circuit board for inspection are formed.

As illustrated in FIG. 3, each of the elastic anisotropically conductive films 20, a base material of which is composed of an elastic polymeric substance has a functional part 21 composed of a plurality of conductive parts 22 for connection each extending in the thickness-wise direction (direction perpendicular to the paper surface in FIG. 3) of the film and insulating parts 23 formed around the respective conductive parts 22 for connection and mutually insulating these conductive parts 22 for connection. The functional part 21 is arranged so as to be located in the anisotropically conductive film-arranging hole 11 in the frame plate 10. The conductive parts 22 for connection in the functional part 21 are arranged in accordance with a pattern corresponding to a pattern of the electrodes to be inspected of the integrated circuits in the wafer as the object for inspection and electrically connected to the electrodes to be inspected in the inspection of the wafer.

At an outer peripheral edge of the functional part 21 is integrally and continuously formed a supported part 25, which has been fixed to and supported by the inner periphery about the anisotropically conductive film-arranging hole 11 in the frame plate 10. More specifically, the supported part 25 in this embodiment is shaped in a forked form and fixed and supported in a closely contacted state so as to grasp the inner periphery about the anisotropically conductive film-arranging hole 11 in the frame plate 10.

In the conductive parts 22 for connection in the functional part 21 of the elastic anisotropically conductive film 20, conductive particles P exhibiting magnetism are contained at high density in a state oriented so as to align in the thickness-wise direction as illustrated in FIG. 4. On the other hand, the insulating parts 23 do not contain the conductive particles P at all or scarcely contain them. The supported part 25 in the elastic anisotropically conductive film 20 contains the conductive particles P.

In the embodiment illustrated, projected parts 24 protruding from other surfaces than portions, at which the conductive parts 22 for connection and peripheries thereof are located, are formed at those portions on both sides of the functional part 21 in the elastic anisotropically conductive film 20.

The thickness of the frame plate 10 varies according to the material thereof, but is preferably 20 to 600 μm, more preferably 40 to 400 μm.

If this thickness is smaller than 20 μm, the strength required upon use of the resulting anisotropically conductive connector is not obtained, and the anisotropically conductive connector tends to be low in the durability. In addition, stiffness of a degree to retain the form of the frame plate is not achieved, and the handling property of the anisotropically conductive connector becomes low. If the thickness exceeds 600 μm on the other hand, the elastic anisotropically conductive films 20 formed in the anisotropically conductive film-arranging holes 11 become too great in thickness, and it may be difficult in some cases to achieve good conductivity in the conductive parts 22 for connection and insulating property between adjacent conductive parts 22 for connection.

The form and size of the anisotropically conductive film-arranging holes 11 in the frame plate 10 in the plane direction are designed according to the size, pitch and pattern of electrodes to be inspected in a wafer as an object for inspection.

No particular limitation is imposed on a material for forming the frame plate 10 so far as it has some degree of stiffness that the resulting frame plate 10 is hard to be deformed, and the form thereof is stably retained. For example, various kinds of materials such as metallic materials, ceramic material and resin materials may be used. When the frame plate 10 is formed by, for example, a metallic material, an insulating film may be formed on the surface of the frame plate 10.

Specific examples of the metallic material for forming the frame plate 10 include metals such as iron, copper, nickel, chromium, cobalt, magnesium, manganese, molybdenum, indium, lead, palladium, titanium, tungsten, aluminum, gold, platinum and silver, and alloys or alloy steels composed of a combination of at least two of these metals.

Specific examples of the resin material forming the frame plate 10 include liquid crystal polymers and polyimide resins.

The frame plate 10 may preferably exhibit magnetism at least at the inner peripheral edges about the anisotropically conductive film-arranging holes thereof, i.e., portions supporting the elastic anisotropically conductive films 20 in that the conductive particles P can be caused to be contained with ease in the supported parts 25 in the elastic anisotropically conductive films 20 by a process which will be described subsequently. Specifically, those portions may preferably have a saturation magnetization of at least 0.1 $Wb/m^2$. In particular, the whole frame plate 10 may preferably be formed by a magnetic substance in that the frame plate 10 is easy to be produced.

Specific examples of the magnetic substance forming such a frame plate 10 include iron, nickel, cobalt, alloys of these magnetic metals, and alloys or alloy steels of these magnetic metals with any other metal.

When the anisotropically conductive connector is used in the WLBI test, it is preferable to use a material having a coefficient of linear thermal expansion of at most $3\times10^{-5}$/K, more preferably $-1\times10^{-7}$ to $1\times10^{-5}$/K, particularly preferably $1\times10^{-6}$ to $8\times10^{-6}$/K as a material for forming the frame plate 10.

Specific examples of such a material include alloys or alloy steels of magnetic metals, such as Invar alloys such as Invar, Elinvar alloys such as Elinvar, Superinvar, covar, and 42 alloy.

The overall thickness (thickness of the conductive part 22 for connection in the illustrated embodiment) of the elastic anisotropically conductive film 20 is preferably 50 to 3,000 μm, more preferably 70 to 2,500 μm, particularly preferably 100 to 2,000 μm. When this thickness is 50 μm or greater, elastic anisotropically conductive films 20 having sufficient strength are provided with certainty. When this thickness is 3,000 μm or smaller on the other hand, conductive parts 22 for connection having necessary conductive properties are provided with certainty.

The projected height of each projected part 24 is preferably in total, at least 10% of the thickness of the projected part 24, more preferably at least 20%. Projected parts 24 having such a projected height are formed, whereby the conductive parts 22 for connection are sufficiently compressed by small pressing force, so that good conductivity is surely achieved.

The projected height of the projected part 24 is preferably at most 100%, more preferably at most 70% of the shortest width or diameter of the projected part 24. Projected parts 24 having such a projected height are formed, whereby the projected parts are not buckled when they are pressurized, so that the prescribed conductivity is surely achieved.

The thickness (thickness of one of the forked portion in the illustrated embodiment) of the supported part 25 is preferably 5 to 600 μm, more preferably 10 to 500 μm, particularly preferably 20 to 400 μm.

It is not essential to form the supported part 25 in the forked form, and it may be fixed to only one surface of the frame plate 10.

The elastic polymeric substance forming the anisotropically conductive films 20 is preferably a heat-resistant polymeric substance having a crosslinked structure. As a curable polymeric substance-forming material usable for obtaining such a crosslinked polymeric substance, may be used various materials. Specific examples thereof include silicone rubber, conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block copolymer rubber and styrene-isoprene block copolymers, and hydrogenated products thereof; and besides chloroprene rubber, urethane rubber, polyester rubber, epichlorohydrin rubber, ethylene-propylene copolymer rubber, ethylene-propylene-diene copolymer rubber and soft liquid epoxy rubber.

Among these, silicone rubber is preferred from the viewpoints of molding and processing ability and electrical properties.

The silicone rubber is preferably that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

Among these, vinyl group-containing liquid silicone rubber (vinyl group-containing dimethyl polysiloxane) is generally obtained by subjecting dimethyldichlorosilane or dimethyldialkoxysilane to hydrolysis and condensation reaction in the presence of dimethylvinylchlorosilane or dimethylvinylalkoxysilane and then fractionating the reaction product by, for example, repeated dissolution-precipitation.

Liquid silicone rubber having vinyl groups at both terminals thereof is obtained by subjecting a cyclic siloxane such as octamethylcyclotetrasiloxane to anionic polymerization in the presence of a catalyst, using, for example, dimethyldivinylsiloxane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such a vinyl group-containing dimethyl polysiloxane preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 from the viewpoint of the heat resistance of the resulting elastic anisotropically conductive films 20.

On the other hand, hydroxyl group-containing liquid silicone rubber (hydroxyl group-containing dimethyl polysiloxane) is generally obtained by subjecting dimethyldichlorosilane or dimethyldialkoxysilane to hydrolysis and condensation reaction in the presence of dimethylhydrochlorosilane or dimethylhydroalkoxysilane and then fractionating the reaction product by, for example, repeated dissolution-precipitation.

The hydroxyl group-containing liquid silicone rubber is also obtained by subjecting a cyclic siloxane to anionic polymerization in the presence of a catalyst, using, for example, dimethylhydrochlorosilane, methyldihydrochlorosilane or dimethylhydroalkoxysilane as a polymerization terminator and suitably selecting other reaction conditions (for example, amounts of the cyclic siloxane and polymerization terminator). As the catalyst for the anionic polymerization, may be used an alkali such as tetramethylammonium hydroxide or n-butylphosphonium hydroxide or a silanolate solution thereof. The reaction is conducted at a temperature of, for example, 80 to 130° C.

Such a hydroxyl group-containing dimethyl polysiloxane preferably has a molecular weight Mw of 10,000 to 40,000. It also preferably has a molecular weight distribution index of at most 2 from the viewpoint of the heat resistance of the resulting elastic anisotropically conductive films 20.

In the present invention, either one of the above-described vinyl group-containing dimethyl polysiloxane and hydroxyl group-containing dimethyl polysiloxane may be used, or both may be used in combination.

A curing catalyst for curing the polymeric substance-forming material may be contained in the polymeric substance-forming material. As such a curing catalyst, may be used an organic peroxide, fatty acid azo compound, hydrosilylated catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphite and platinum, acetyl acetate platinum chelates, and cyclic diene-platinum complexes.

The amount of the curing catalyst used is suitably selected according to the kind of the polymeric substance-forming material, the kind of the curing catalyst and other curing treatment conditions. However, it is generally 3 to 15 parts by weight per 100 parts by weight of the polymeric substance-forming material.

As the conductive particles P contained in the conductive parts 22 for connection and the supported parts 25 in each of the elastic anisotropically conductive films 20, those exhibiting magnetism are preferably used in that such conductive particles P can be easily moved in a molding material for forming the elastic anisotropically conductive film 20 by a process which will be described subsequently. Specific examples of such conductive particles P exhibiting magnetism include particles of metals exhibiting magnetism, such as iron, nickel and cobalt, particles of alloys thereof, particles containing such a metal, particles obtained by using these particles as core particles and plating surfaces of the core particles with a metal having good conductivity, such as gold, silver, palladium or rhodium, particles obtained by using particles of a non-magnetic metal, particles of an inorganic substance, such as glass beads, or particles of a polymer as core particles and plating surfaces of the core particles with a conductive magnetic substance such as nickel or cobalt, or coating the core particles with both conductive magnetic substance and metal having good conductivity.

Among these, particles obtained by using nickel particles as core particles and plating their surfaces with a metal having good conductivity, such as gold or silver are preferably used.

No particular limitation is imposed on the means for coating the surfaces of the core particles with the conductive metal. However, for example, the coating may be conducted by electroless plating.

When those obtained by coating the surfaces of the core particles with the conductive metal are used as the conductive particles P, the coating rate (proportion of an area coated with the conductive metal to the surface area of the core particles) of the conductive metal on the particle surfaces is preferably at least 40%, more preferably at least 45%, particularly preferably 47 to 95% from the viewpoint of achieving good conductivity.

The amount of the conductive metal coated is preferably 2.5 to 50% by weight, more preferably 3 to 45% by weight, further preferably 3.5 to 40% by weight, particularly preferably 5 to 30% by weight based on the core particles.

The particle diameter of the conductive particles P is preferably 1 to 500 μm, more preferably 2 to 400 μm, further preferably 5 to 300 μm, particularly preferably 10 to 150 μm.

The particle diameter distribution (Dw/Dn) of the conductive particles P is preferably 1 to 10, more preferably 1 to 7, further preferably 1 to 5, particularly preferably 1 to 4.

When conductive particles P satisfying such conditions are used, the resulting elastic anisotropically conductive films 20 become easy to deform under pressure, and sufficient electrical contact is achieved among the conductive particles P in the conductive parts 22 for connection in the elastic anisotropically conductive films 20.

No particular limitation is imposed on the shape of the conductive particles P. However, they are preferably in the shape of a sphere or star, or a mass of secondary particles obtained by aggregating these particles from the viewpoint of permitting easy dispersion of these particles in the polymeric substance-forming material.

The content of water in the conductive particles P is preferably at most 5%, more preferably at most 3%, further preferably at most 2%, particularly preferably at most 1%. The use of conductive particles P satisfying such conditions can prevent or inhibit the occurrence of bubbles in the molding material layers upon the curing treatment of the molding material layers in a production process, which will be described subsequently.

The surfaces of the conductive particles P may be suitably treated with a coupling agent such as a silane coupling agent. By treating the surfaces of the conductive particles P with the coupling agent, the adhesion property of the conductive particles P to the elastic polymeric substances is enhanced, so that the resulting elastic anisotropically conductive films 20 become high in durability in repeated use.

The amount of the coupling agent used is suitably selected within limits not affecting the conductivity of the conductive particles P. However, it is preferably such an amount that a coating rate (proportion of an area coated with the coupling agent to the surface area of the conductive core particles) of the coupling agent on the surfaces of the conductive particles P amounts to at least 5%, more preferably 7 to 100%, further preferably 10 to 100%, particularly preferably 20 to 100%.

The proportion of the conductive particles P contained in the conductive parts 22 for connection in the functional part 21 is preferably 10 to 60%, more preferably 15 to 50% in terms of volume fraction. If this proportion is lower than 10%, conductive parts 22 for connection sufficiently low in electric resistance value may not be obtained in some cases. If the proportion exceeds 60% on the other hand, the resulting conductive parts 22 for connection are liable to be brittle, so that elasticity required of the conductive parts 22 for connection may not be achieved in some cases.

The proportion of the conductive particles P contained in the supported parts 25 varies according to the content of the conductive particles in the molding material for forming the elastic anisotropically conductive films 20. However, it is preferably equivalent to or more than the proportion of the conductive particles contained in the molding material in that the conductive particles P are surely prevented from being contained in excess in the conductive parts 22 for connection located most outside among the conductive parts 22 for connection in the elastic anisotropically conductive films 20. It is also preferably be at most 30% in terms of volume fraction in that supported parts 25 having sufficient strength are provided.

In the polymeric substance-forming material, may be contained a general inorganic filler such as silica powder, colloidal silica, aerogel silica or alumina as needed. By containing such an inorganic filler, the thixotropic property of the resulting molding material is ensured, the viscosity thereof becomes high, the dispersion stability of the conductive particles P is improved, and moreover the strength of the elastic anisotropically conductive films 20 obtained by a curing treatment can be made high.

No particular limitation is imposed on the amount of such an inorganic filler used. However, the use in a too large amount is not preferred because the movement of the conductive particles P by a magnetic field is greatly inhibited in the production process, which will be described subsequently.

The anisotropically conductive connector described above may be produced, for example, in the following manner.

A frame plate 10, in which anisotropically conductive film-arranging holes 11 have been formed corresponding to a pattern of electrode regions, in which electrodes to be inspected have been formed, in integrated circuits in a wafer as an object for inspection, and composed of a magnetic metal is first produced. As a means for forming the anisotropically conductive film-arranging holes 11 in the frame plate 10, may be used, for example, an etching method or the like.

Figure 5:
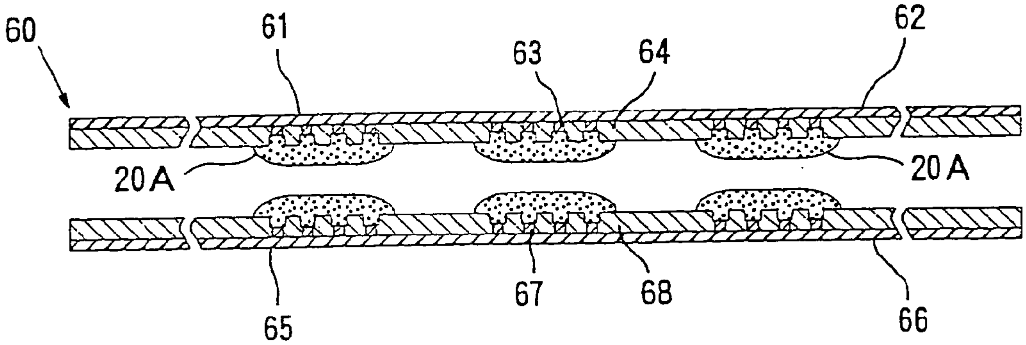
FIG. 5 is a cross-sectional view illustrating a state that molding material layers are formed by a molding material which has been applied to a mold for molding elastic anisotropically conductive films.

A molding material for forming elastic anisotropically conductive films in which conductive particles exhibiting magnetism are dispersed in a polymeric substance-forming material, which will become an elastic polymeric substance by a curing treatment is then prepared. As illustrated in FIG. 5, a mold 60 for molding elastic anisotropically conductive films is provided, and the molding material is coated on the molding surfaces of each of a top force 61 and a bottom force 65 of the mold 60 in accordance with a prescribed pattern, namely, an arrangement pattern of elastic anisotropically conductive films to be formed, thereby forming molding material layers 20A.

Here, the mold 60 will be described specifically. The mold 60 is so constructed that the top force 61 and the bottom force 65 making a pair therewith are arranged so as to be opposed to each other.

Figure 6:
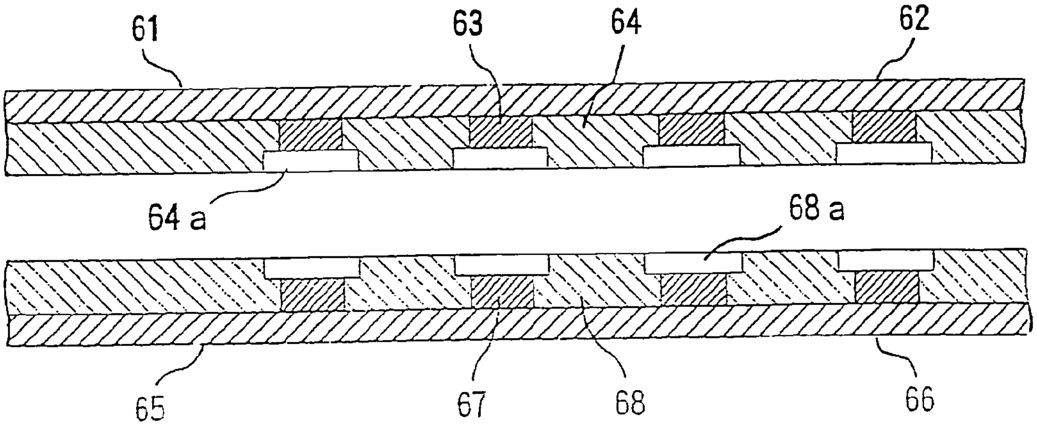
FIG. 6 is a cross-sectional view illustrating, on an enlarged scale, a part of the mold for molding elastic anisotropically conductive films.

In the top force 61, ferromagnetic substance layers 63 are formed on the lower surface of a base plate 62 in accordance with a pattern antipodal to an arrangement pattern of the conductive parts 22 for connection in each of the elastic anisotropically conductive films 20 to be molded, and non-magnetic substance layers 64 are formed at other areas than the ferromagnetic substance layers 63 as illustrated in FIG. 6, on an enlarged scale. The molding surface is formed by these ferromagnetic substance layers 63 and non-magnetic substance layers 64. Recesses **64*a* are formed in the molding surface of the top force 61 corresponding to the projected parts 24 in the elastic anisotropically conductive films 20** to be molded.

In the bottom force 65 on the other hand, ferromagnetic substance layers 67 are formed on the upper surface of a base plate 66 in accordance with the same pattern as the arrangement pattern of the conductive parts 22 for connection in the elastic anisotropically conductive films 20 to be molded, and non-magnetic substance layers 68 are formed at other areas than the ferromagnetic substance layers 67. The molding surface is formed by these ferromagnetic substance layers 67 and non-magnetic substance layers 68. Recesses **68*a* are formed in the molding surface of the bottom force 65 corresponding to the projected parts 24 in the elastic anisotropically conductive films 20** to be molded.

The respective base plates 62 and 66 in the top force 61 and bottom force 65 are preferably formed by a ferromagnetic substance. Specific examples of such a ferromagnetic substance include ferromagnetic metals such as iron, iron-nickel alloys, iron-cobalt alloys, nickel and cobalt. The base plates 62, 66 preferably have a thickness of 0.1 to 50 mm, and are preferably smooth at surfaces thereof, subjected to a chemical degreasing treatment or subjected to a mechanical polishing treatment.

As a material for forming the ferromagnetic substance layers 63, 67 in each of top force 61 and bottom force 65, may be used a ferromagnetic metal such as iron, iron-nickel alloy, iron-cobalt alloy, nickel or cobalt. The ferromagnetic substance layers 63, 67 preferably have a thickness of at least 10 μm. When this thickness is at least 10 μm, a magnetic field having sufficient intensity distribution can be applied to the molding material layers 20A. As a result, the conductive particles can be gathered at a high density at portions to become conductive parts 22 for connection in the molding material layers 20A, and so conductive parts 22 for connection having good conductivity can be provided.

As a material for forming the non-magnetic substance layers 64, 68 in each of top force 61 and bottom force 65, may be used a non-magnetic metal such as copper, a polymeric substance having heat resistance, or the like. However, a polymeric substance cured by radiation may preferably used in that the non-magnetic substance layers 64, 68 can be easily formed by a technique of photolithography. As a material thereof, may be used, for example, a photoresist such as an acrylic type dry film resist, epoxy type liquid resist or polyimide type liquid resist.

As a method for coating the molding surfaces of the top force 61 and bottom force 65 with the molding material, may preferably be used a screen printing method. According to such a method, the molding material can be easily coated according to a necessary pattern, and a proper amount of the molding material can be applied.

Figure 7:
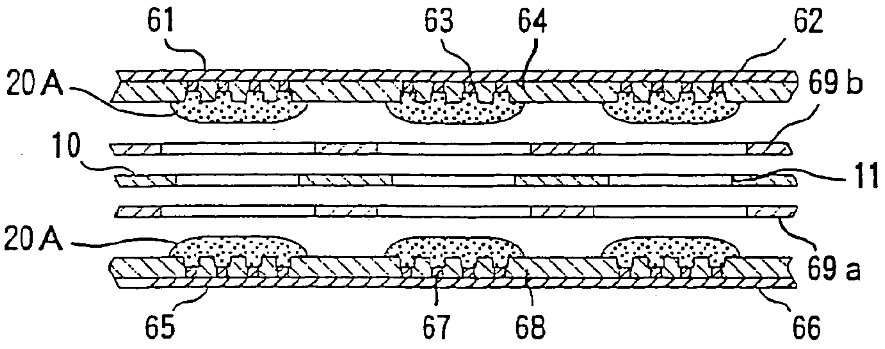
FIG. 7 is a cross-sectional view illustrating a state that a frame plate has been arranged through spacers between a top force and a bottom force of the mold shown in FIG. 5.
Figure 8:
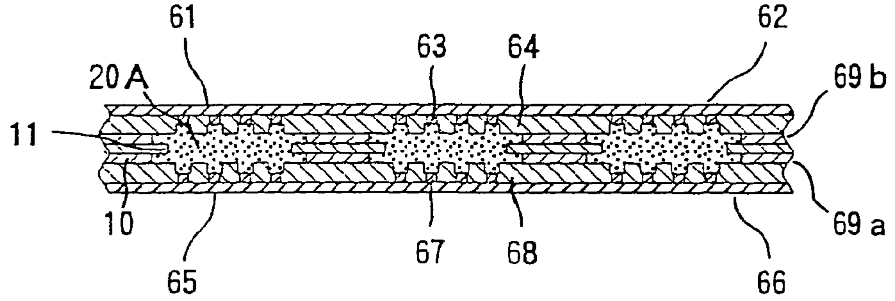
FIG. 8 is a cross-sectional view illustrating a state that molding material layers of the intended form have been formed between the top force and the bottom force of the mold.
Figure 9:
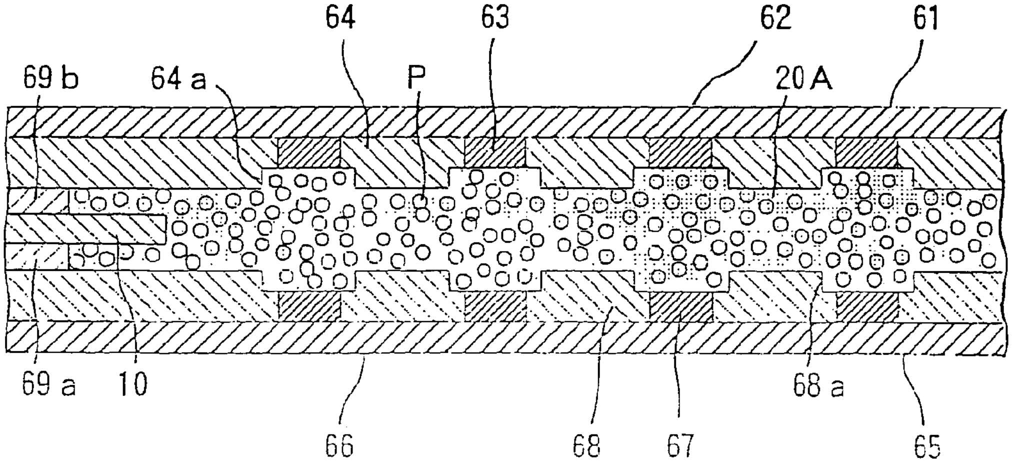
FIG. 9 is a cross-sectional view illustrating, on an enlarged scale, the molding material layer shown in FIG. 8.

As illustrated in FIG. 7, the frame plate 10 is arranged in alignment through a spacer 69*a* on the molding surface of the bottom force 65, on which the molding material layers 20A have been formed, and on the frame plate 10, the top force 61, on which the molding material layers 20A have been formed, is arranged in alignment through a spacer 69*b*. These top and bottom forces are superimposed on each other, whereby molding material layers 20A of the intended shape (shape of the elastic anisotropically conductive films 20 to be formed) are formed between the top force 61 and the bottom force 65 as illustrated in FIG. 8. In each of these molding material layers 20A, the conductive particles P are contained in a state dispersed throughout in the molding material layer 20A as illustrated in FIG. 9.

The spacers 69*a*, 69*b* are arranged between the frame plate 10 and the bottom force 65 and, between the frame plate 10 and the top force 61, respectively, whereby the intended elastic anisotropically conductive films of the intended form can be formed, and adjacent elastic anisotropically conductive films are prevented from being connected to each other, so that a number of anisotropically conductive films independent of one another can be formed with certainty.

Figure 10:
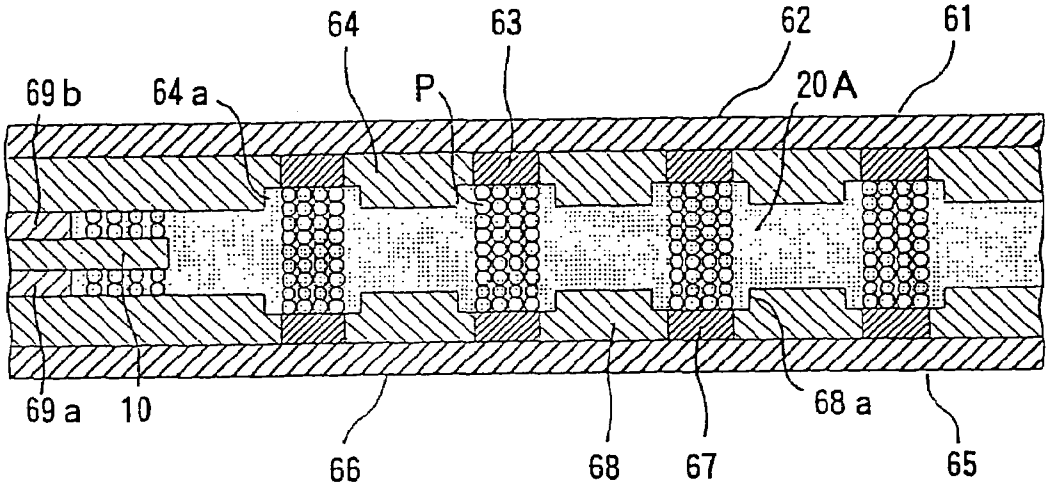
FIG. 10 is a cross-sectional view illustrating a state that a magnetic field having strength distribution has been applied to the molding material layer shown in FIG. 9 in a thickness-wise direction thereof.

A pair of, for example, electromagnets are then arranged on the upper surface of the base plate 62 in the top force 61 and the lower surface of the base plate 66 in the bottom force 65, and the electromagnets are operated, whereby a magnetic field having higher intensity at portions between the ferromagnetic substance layers 63 of the top force 61 and their corresponding ferromagnetic substance layers 67 of the bottom force 65 than surrounding regions thereof is formed because the top force 61 and the bottom force 65 have ferromagnetic substance layers 63, 67 respectively. As a result, in the molding material layers 20*a*, the conductive particles P dispersed in the molding material layers 20A are gathered at portions to become the conductive parts 22 for connection located between the ferromagnetic substance layers 63 of the top force 61 and their corresponding ferromagnetic substance layers 67 of the bottom force 65, and oriented so as to align in the thickness-wise direction of the molding material layers as illustrated in FIG. 10. In the above-described process, the frame plate 10 is composed of the magnetic metal, so that a magnetic field having higher intensity at portions between the frame plate 10, and the each of top plate 61 and bottom plate 65 than vicinities thereof. As a result, the conductive particles P existing above and below the frame plate 10 in the molding material layers 20A are not gathered between the ferromagnetic substance layers 63 of the top force 61 and the ferromagnetic substance layers 67 of the bottom force 65, but remain retained above and below the frame plate 10.

In this state, the molding material layers 20A are subjected to a curing treatment, whereby the elastic anisotropically conductive films 20 each composed of a functional part 21, in which a plurality of conductive parts 22 for connection containing the conductive particles P in the elastic polymeric substance in a state oriented so as to align in the thickness-wise direction are arranged in a state mutually insulated by an insulating part 23 composed of the elastic polymeric substance, in which the conductive particles P are not present at all or scarcely present, and a supported part 25, which is continuously and integrally formed at a peripheral edge of the functional part 21 and in which the conductive particles P are contained in the elastic polymeric substance, are formed in a state that the supported part 25 has been fixed to the inner periphery about each anisotropically conductive film-arranging hole 11 of the frame plate 10, thereby producing an anisotropically conductive connector.

In the above-described process, the intensity of the external magnetic field applied to the portions to become the conductive parts 22 for connection and the portion to become the supported parts 25 in the molding material layers 20A is preferably an intensity that it amounts to 0.1 to 2.5 T on the average.

The curing treatment of the molding material layers 20A is suitably selected according to the material used. However, the treatment is generally conducted by a heating treatment. When the curing treatment of the molding material layers 20A is conducted by heating, it is only necessary to provide a heater in an electromagnet. Specific heating temperature and heating time are suitably selected in view of the kinds of the polymeric substance-forming material and the like, the time required for movement of the conductive particles P, and the like.

According to the anisotropically conductive connector described above, it is hard to be deformed and easy to handle because the supported parts 25 is formed at the peripheral edge of the functional part 21 having the conductive parts 22 for connection, and this supported part 25 is fixed to the inner periphery about the anisotropically conductive film-arranging hole 11 in the frame plate 10, whereby the positioning and the holding and fixing to a wafer as an object for inspection can be easily conducted upon an electrically connecting operation to the wafer.

Since the anisotropically conductive connector is obtained by subjecting the molding material layers 20A to the curing treatment in a state that the conductive particles P have been retained in the portions to become the supported parts 25 in the molding material layers 20A by, for example, applying a magnetic field to those portions in the formation of the elastic anisotropically conductive films 20, the conductive particles P existing in the portions to become the supported parts 25 in the molding material layers 20A, i.e. portions located above and below the inner peripheries about the anisotropically conductive film-arranging holes 11 in the frame plate 10, are not gathered at the portions to become the conductive parts 22 for connection, so that the conductive particles P are prevented from being contained in excess in the conductive parts 22 for connection located most outside among the conductive parts 22 for connection in the resulting elastic anisotropically conductive films 20. Accordingly, there is no need of reducing the content of the conductive particles P in the molding material layers 20A, so that good conductivity is achieved with certainty in all the conductive parts 22 for connection in the elastic anisotropically conductive films 20, and moreover insulating property between adjacent conductive parts 22 for connection can be achieved with certainty.

Since each of the anisotropically conductive film-arranging holes 11 in the frame plate 10 is formed corresponding to an electrode region in which electrodes to be inspected of integrated circuits in a wafer as an object for inspection have been formed, and the elastic anisotropically conductive film 20 arranged in the each of anisotropically conductive film-arranging hole 11 may be small in area, the individual elastic anisotropically conductive films 20 are easy to be formed. In addition, since the elastic anisotropically conductive film 20 small in area is little in the absolute quantity of thermal expansion in a plane direction of the elastic anisotropically conductive film 20 even when it is subjected to thermal hysteresis, the thermal expansion of the elastic anisotropically conductive film 20 in the plane direction is surely restrained by the frame plate by using a material having a low coefficient of linear thermal expansion as that for forming the frame plate 10. Accordingly, a good electrically connected state can be stably retained even when the WLBI test is performed on a large-area wafer.

Since the positioning holes 16 are formed in the frame plate 10, positioning to the wafer as the object for inspection or the circuit board for inspection can be easily conducted.

Since the air circulating holes 15 are formed in the frame plate 10, air existing between the anisotropically conductive connector and the circuit board for inspection is discharged through the air circulating holes 15 of the frame plate 10 at the time the pressure within a chamber is reduced when that by the pressure reducing system is utilized as the means for pressing the probe member in an inspection apparatus for wafer, which will be described subsequently, whereby the anisotropically conductive connector can be surely brought into close contact with the circuit board for inspection, so that necessary electrical connection can be achieved with certainty.

[Inspection Apparatus for Wafer]

Figure 11:
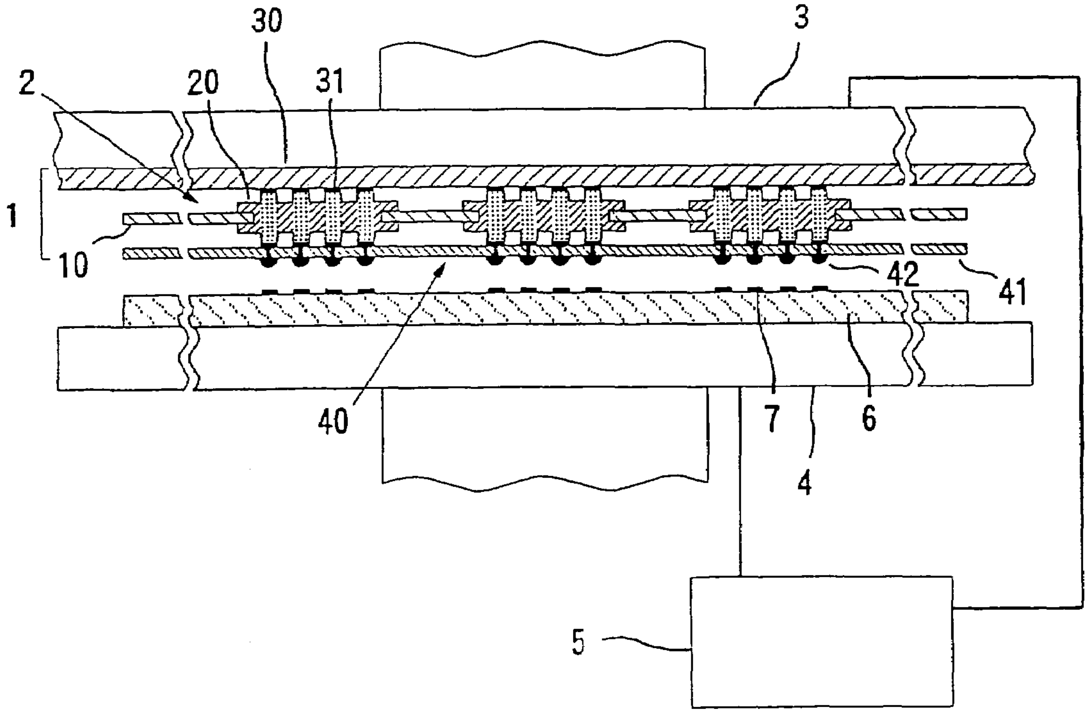
FIG. 11 is a cross-sectional view illustrating the construction of an exemplary inspection apparatus for wafer making good use of the anisotropically conductive connector according to the present invention.

FIG. 11 is a cross-sectional view schematically illustrating the construction of an exemplary inspection apparatus for wafer making use of the anisotropically conductive connector according to the present invention. The inspection apparatus for wafer serves to perform electrical inspection of each of a plurality of integrated circuits formed on a wafer in a state of the wafer.

Figure 12:
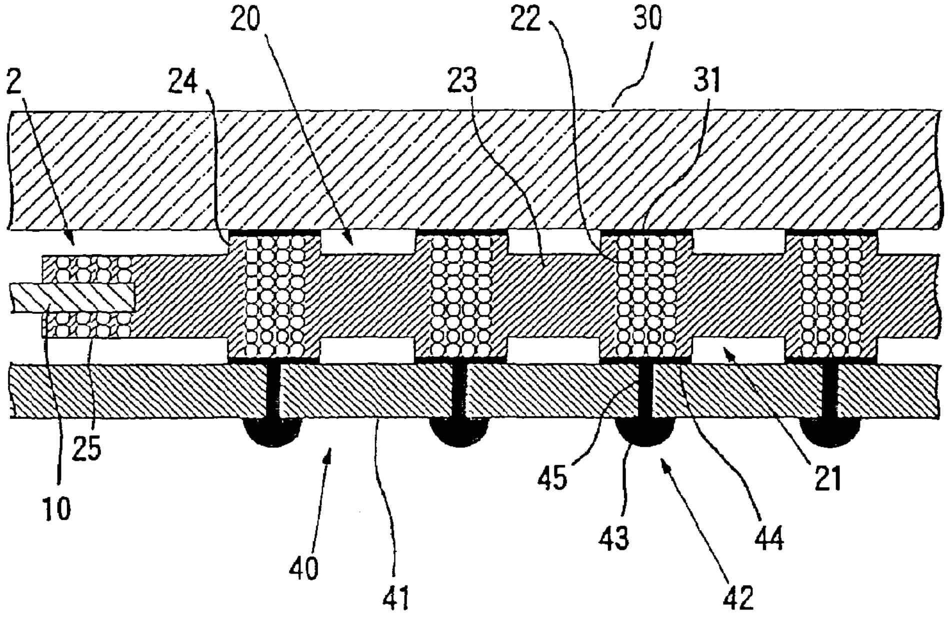
FIG. 12 is a cross-sectional view illustrating the construction of a principal part of an exemplary probe member according to the present invention.

The inspection apparatus for wafer shown in FIG. 11 has a probe member 1 for conducting electrical connection of each of electrodes 7 to be inspected of a wafer 6 as an object for inspection to a tester. As also illustrated on an enlarged scale in FIG. 12, the probe member 1 has a circuit board 30 for inspection, on the front surface (lower surface in FIG. 11) of which a plurality of inspection electrodes 31 have been formed in accordance with a pattern corresponding to a pattern of the electrodes 7 to be inspected of the wafer 6 as the object for inspection. On the surface of the circuit board 30 for inspection is provided the anisotropically conductive connector 2 of the structure illustrated in FIGS. 1 to 4 in such a manner that the conductive parts 22 for connection in the elastic anisotropically conductive films 20 of the connector are opposed to and brought into contact with the inspection electrodes 31 of the circuit board 30 for inspection, respectively. On the front surface (lower surface in FIG. 11) of the anisotropically conductive connector 2 is provided a sheet-like connector 40, in which a plurality of electrode structures 42 have been arranged in an insulating sheet 41 in accordance with the pattern corresponding to the pattern of the electrodes 7 to be inspected of the wafer 6 as the object for inspection, in such a manner that the electrode structures 42 are opposed to and brought into contact with the conductive parts 22 for connection in the elastic anisotropically conductive films 20 of the anisotropically conductive connector 2, respectively.

On the back surface (upper surface in FIG. 11) of the circuit board 30 for inspection in the probe member 1 is provided a pressing plate 3 for pressurizing the probe member 1 downward. A wafer mounting table 4, on which the wafer 6 as the object for inspection is mounted, is provided below the probe member 1. A heater 5 is connected to each of the pressing plate 3 and the wafer mounting table 4.

As a base material for making up the circuit board 30 for inspection, may be used each of conventionally known various base materials. Specific examples thereof include composite resin materials such as glass fiber-reinforced epoxy resins, glass fiber-reinforced phenol resins, glass fiber-reinforced polyimide resins and glass fiber-reinforced bismaleimidotriazine resins, and ceramic materials such as glass, silicon dioxide and alumina.

When an inspection apparatus for wafer for performing the WLBI test is constructed, a material having a coefficient of linear thermal expansion of at most $3\times10^{-5}$/K, more preferably $1\times10^{-7}$ to $1\times10^{-5}$/K, particularly preferably $1\times10^{-6}$ to $6\times10^{-6}$/K is preferably used as the base material.

Specific examples of such a base material include Pyrex glass, quartz glass, alumina, beryllia, silicon carbide, aluminum nitride and boron nitride.

The sheet-like connector 40 in the probe member 1 will be described specifically. The sheet-like connector 40 has a flexible insulating sheet 41, and in this insulating sheet 41, a plurality of electrode structures 42 and composed of a metal extending in the thickness-wise direction of the insulating sheet 41 are arranged with a space to each other in a plane direction of the insulating sheet 41 in accordance with the pattern corresponding to the pattern of the electrodes 7 to be inspected of the wafer 6 as the object for inspection.

Each of the electrode structures 42 is formed by integrally connecting a projected front-surface electrode part 43 exposed to the front surface (lower surface in FIG. 12) of the insulating sheet 41 and a plate-like back-surface electrode part 44 exposed to the back surface of the insulating sheet 41 to each other by a short circuit part 45 extending through in the thickness-wise direction of the insulating sheet 41.

No particular limitation is imposed on the insulating sheet 41 so far as it has insulating property and is flexible. For example, a resin sheet formed of a polyamide resin, liquid crystal polymer, polyester, fluororesins or the like, or a sheet obtained by impregnating a cloth woven by fibers with any of the above-described resins may be used.

No particular limitation is also imposed on the thickness of the insulating sheet 41 so far as such an insulating sheet 41 is flexible. However, it is preferably 10 to 50 μm, more preferably 10 to 25 μm.

As a metal for forming the electrode structures 42, may be used nickel, copper, gold, silver, palladium, iron or the like. The electrode structures 42 as a whole may be any of those formed of a single metal, those formed of an alloy of at least two metals and those obtained by laminating at least two metals.

On the surfaces of the front-surface electrode part 43 and back-surface electrode part 44 in the electrode structure 42, a film of a chemically stable metal having high conductivity, such as gold, silver or palladium is preferably formed in that oxidation of the electrode parts is prevented, and electrode parts small in contact resistance are obtained.

The projected height of the front-surface electrode part 43 in the electrode structure 42 is preferably 15 to 50 μm, more preferably 15 to 30 μm in that stable electrical connection to the electrode 7 to be inspected of the wafer 6 can be achieved. The diameter of the front-surface electrode part 43 is preset according to the size and pitch of the electrodes to be inspected of the wafer 6 and is, for example, 30 to 80 μm, preferably 30 to 50 μm.

The diameter of the back-surface electrode part 44 in the electrode structure 42 may be greater than the diameter of the short circuit part 45 and smaller than the arrangement pitch of the electrode structures 42 and is preferably great as much as possible, whereby stable electrical connection to the conductive part 22 for connection in the elastic anisotropically conductive film 20 of the anisotropically conductive connector 20 can also be achieved with certainty. The thickness of the back-surface part 44 is preferably 20 to 50 μm, more preferably 35 to 50 μm in that the strength is sufficiently high and excellent repetitive durability is achieved.

The diameter of the short circuit part 45 in the electrode structure 42 is preferably 30 to 80 μm, more preferably 30 to 50 μm in that sufficiently high strength is achieved.

The sheet-like connector 40 can be produced, for example, in the following manner.

A laminate material obtained by laminating a metal layer on an insulating sheet 41 is provided, and a plurality of through-holes extending through in the thickness-wise direction of the insulating sheet 41 are formed in the insulating sheet 41 of the laminate material in accordance with a pattern corresponding to a pattern of electrode structures 42 to be formed by laser processing, dry etch processing or the like. This laminate material is then subjected to photolithography and plating treatment, whereby short circuit parts 45 integrally connected to the metal layer are formed in the through-holes in the insulating sheet 41, and at the same time, projected front-surface electrode parts 43 integrally connected to the respective short circuit parts 45 are formed on the front surface of the insulating sheet 41. Thereafter, the metal layer of the laminate material is subjected to a photo-etching treatment to remove a part thereof, thereby forming back-surface electrode parts 44 to form the electrode structures 42, whereby the sheet-like connector 40 is provided.

In such an electrical inspection apparatus, a wafer 6 as an object for inspection is mounted on the wafer mounting table 4, and the probe member 1 is then pressurized downward by the pressing plate 3, whereby the respective front-surface electrode parts 43 in the electrode structures 42 of the sheet-like connector 40 thereof are brought into contact with their corresponding electrodes 7 to be inspected of the wafer 6, and further the respective electrodes 7 to be inspected of the wafer 6 are pressurized by the front-surface electrodes parts 43. In this state, the each of the conductive parts 22 for connection in the elastic anisotropically conductive films 20 of the anisotropically conductive connector 2 are held and pressurized by the inspection electrodes 31 of the circuit board 30 for inspection and the front-surface electrode parts

43 in the electrode structures 42 of the sheet-like connector 40 and compressed in the thickness-wise direction of the elastic anisotropically conductive films 20, whereby conductive paths are formed in the respective conductive parts 22 for connection in the thickness-wise direction thereof. As a result, electrical connection between the electrodes 7 to be inspected of the wafer 6 and the inspection electrodes 31 of the circuit board 30 for inspection is achieved. Thereafter, the wafer 6 is heated to a prescribed temperature by the heater 5 through the wafer mounting table 4 and the pressing plate 3. In this state, necessary electrical inspection is curried out on each of a plurality of integrated circuits in the wafer 6.

According to such an inspection apparatus for wafer, electrical connection to the electrodes 7 to be inspected of the wafer 6 as the object for inspection is achieved through the probe member 1 having the above-described anisotropically conductive connector 2. Therefore, positioning, and holding and fixing to the wafer can be conducted with ease even when the pitch of the electrodes 7 to be inspected is small, and moreover high reliability on connection to each electrode to be inspected is achieved.

Since each elastic anisotropically conductive film 20 in the anisotropically conductive connector 2 is small in its own area, and the absolute quantity of thermal expansion in a plane direction of the elastic anisotropically conductive film 20 is little even when it is subjected to thermal hysteresis, the thermal expansion of the elastic anisotropically conductive film 20 in the plane direction is surely restrained by the frame plate by using a material having a low coefficient of linear thermal expansion as that for forming the frame plate 10. Accordingly, a good electrically connected state can be stably retained even when the WLBI test is performed on a large-area wafer.

Figure 13:
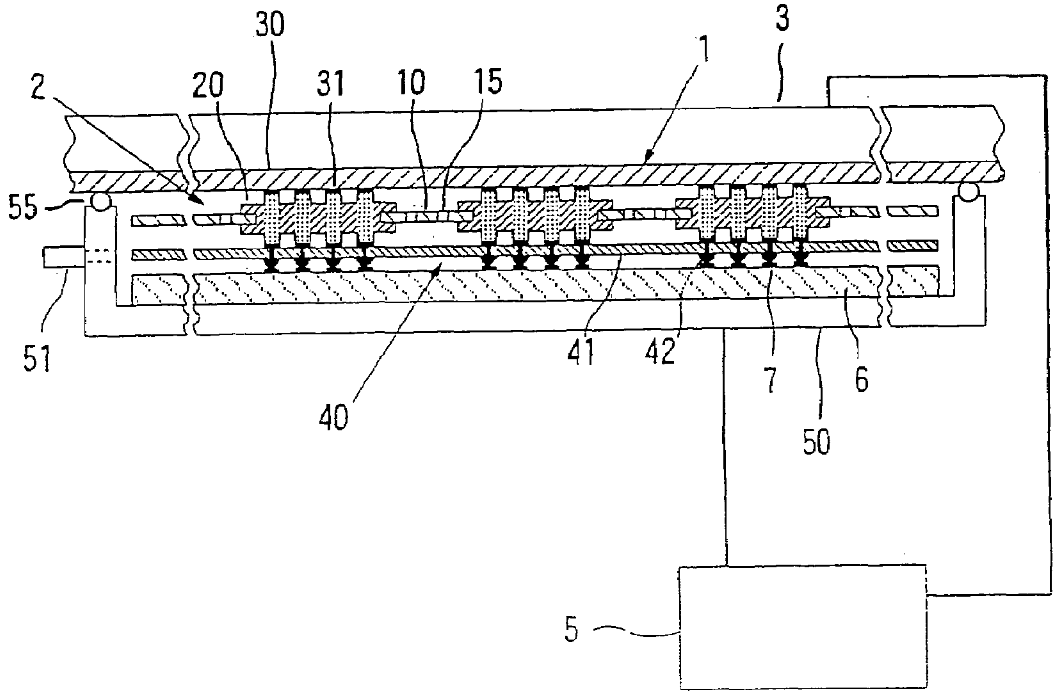
FIG. 13 is a cross-sectional view illustrating the construction of another exemplary inspection apparatus for wafer making good use of the anisotropically conductive connector according to the present invention.

FIG. 13 is a cross-sectional view schematically illustrating the construction of another exemplary inspection apparatus for wafer making use of the anisotropically conductive connector according to the present invention.

This inspection apparatus for wafer has a box-type chamber 50 opened at the top thereof, in which a water 6 as an object for inspection is contained. An evacuation pipe 51 for evacuating air within the chamber 50 is provided in a sidewall of this chamber 50, and an evacuator (not illustrated) such as, for example, a vacuum pump is connected to the evacuation pipe 51.

A probe member 1 of the same structure as the probe member 1 in the inspection apparatus for wafer shown in FIG. 1 is arranged on the chamber 50 so as to air-tightly close the opening of the chamber 50. More specifically, an O-ring 55 having elasticity is arranged in close contact on the upper end surface of the sidewall in the chamber 50, and the probe member 1 is arranged in a state that anisotropically conductive connector 2 and sheet-like connector 40 thereof are contained in the chamber 50 and the periphery of the circuit board 30 for inspection thereof has been brought into close contact with the O-ring 55. In addition, the circuit board 30 for inspection is retained in a state pressurized downward by a pressing plate 3 provided on the back surface (upper surface in FIG. 13) thereof.

A heater 5 is connected to the chamber 50 and the pressing plate 3.

In such an inspection apparatus for wafer, the pressure within the chamber 50 is reduced to, for example, 1,000 Pa or lower by driving the evacuator connected to the evacuation pipe 51 of the chamber 50. As a result, the probe member 1 is pressurized downward by the pressure, whereby the O-ring 55 is elastically deformed, and the probe member 1 is moved downward. As a result, each of electrodes 7 to be inspected of the wafer 6 are respectively pressurized by their corresponding front-surface electrode parts 43 in electrode structures 42 of the sheet-like connector 40. In this state, the each of the conductive parts 22 for connection in the elastic anisotropically conductive films 20 of the anisotropically conductive connector 2 are respectively held and pressurized by the inspection electrodes 31 of the circuit board 30 for inspection and the front-surface electrode parts 43 in the electrode structures 42 of the sheet-like connector 40 and compressed in the thickness-wise direction thereof, whereby conductive paths are formed in the respective conductive parts 22 for connection in the thickness-wise direction thereof. As a result, electrical connection between the electrodes 7 to be inspected of the wafer 6 and the inspection electrodes 31 of the circuit board 30 for inspection is achieved. Thereafter, the wafer 6 is heated to a prescribed temperature by the heater 5 through the chamber 50 and the pressing plate 3. In this state, necessary electrical inspection is curried out on each of a plurality of integrated circuits in the wafer 6.

According to such an inspection apparatus for wafer, the same effects as those in the inspection apparatus for wafer shown in FIG. 11 are brought about. In addition, the whole inspection apparatus can be miniaturized because any large-sized pressing mechanism is not required, and moreover the whole wafer 6 as the object for inspection can be pressed by even force even when the wafer 6 is a wafer having a large area of which the diameter is about 8 inches or greater, for example. In addition, since the air circulating holes 15 are formed in the frame plate 10 in the anisotropically conductive connector 2, air existing between the anisotropically conductive connector 2 and the circuit board 30 for inspection is discharged through the air circulating holes 15 of the frame plate 10 in the anisotropically conductive connector 2 at the time the pressure within the chamber 50 is reduced, whereby the anisotropically conductive connector 2 can be surely brought into close contact with the circuit board 30 for inspection, so that necessary electrical connection can be achieved with certainty.

OTHER EMBODIMENTS

The present invention is not limited to the above-described embodiments, and such various modifications as described below may be added thereto.

(1) In the anisotropically conductive connector, conductive parts for non-connection that are not electrically connected to any electrode to be inspected in a wafer may be formed in the elastic anisotropically conductive films 20 in addition to the conductive parts 22 for connection. The anisotropically conductive connector having anisotropically conductive films, in which the conductive parts for non-connection have been formed, will hereinafter be described.

Figure 14:
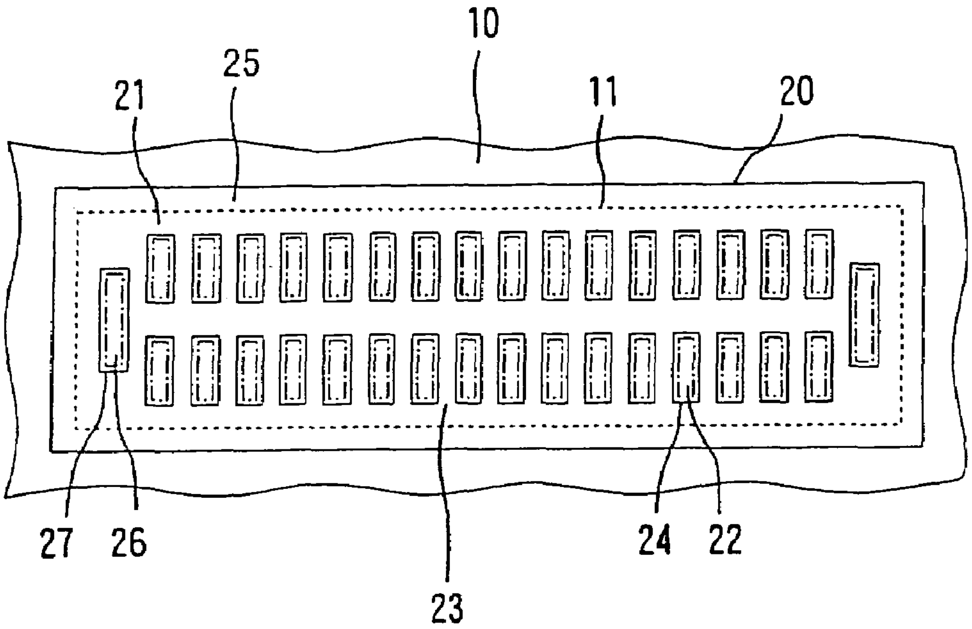
FIG. 14 is a plan view illustrating, on an enlarged scale, an elastic anisotropically conductive film in an anisotropically conductive connector according to another embodiment of the present invention.

FIG. 14 is a plan view illustrating, on an enlarged scale, an elastic anisotropically conductive film in an anisotropically conductive connector according to another embodiment of the present invention. In the elastic anisotropically conductive film 20 of this anisotropically conductive connector, a plurality of conductive parts 22 for connection that are electrically connected to electrodes to be inspected in a wafer as an object for inspection and extend in the thickness-wise direction (direction perpendicular to the paper in FIG. 14) of the film are arranged so as to align in 2 rows in accordance with a pattern corresponding to a pattern of the electrodes to be inspected. These conductive parts 22 for connection contain conductive particles exhibiting magnetism at high density in a state oriented so as to align in the thickness-wise direction and are mutually insulated by an insulating part 23, in which the conductive particles are not contained at all or scarcely contained.

Conductive parts 26 for non-connection that are not electrically connected to any electrode to be inspected in the wafer as the object for inspection and extend in the thickness-wise direction are formed between the conductive parts 22 for connection located most outside in a direction that the conductive parts 22 for connection are arranged and the frame plate 10. The conductive parts 26 for non-connection contain the conductive particles exhibiting magnetism at high density in a state oriented so as to align in the thickness-wise direction and are mutually insulated from the conductive parts 22 for connection by an insulating part 23, in which the conductive particles are not contained at all or scarcely contained.

In the embodiment illustrated, projected parts 24 and projected parts 27 protruding from other surfaces than portions, at which the conductive parts 22 for connection and peripheries thereof are located, and portions, at which the conductive parts 26 for non-connection and peripheries thereof are located, are formed on both sides of the functional part 21 in the elastic anisotropically conductive film 20.

At the peripheral edge of the functional part 21, a supported part 25 that is fixed to and supported by the inner peripheral edge about the anisotropically conductive film-arranging hole 11 in the frame plate 10 is integrally and continuously formed with the functional part 21, and the supported part 25 contains the conductive particles.

Other constitutions are basically the same as those in the anisotropically conductive connector shown in FIGS. 1 to 4.

Figure 15:
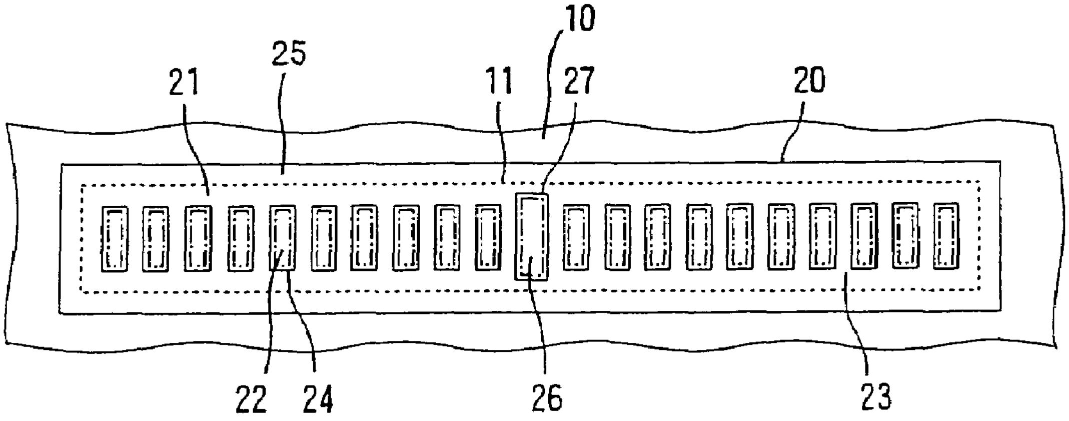
FIG. 15 is a plan view illustrating, on an enlarged scale, an elastic anisotropically conductive film in an anisotropically conductive connector according to a further embodiment of the present invention.

FIG. 15 is a plan view illustrating, on an enlarged scale, an elastic anisotropically conductive film in an anisotropically conductive connector according to a further embodiment of the present invention. In the elastic anisotropically conductive film 20 of this anisotropically conductive connector, a plurality of conductive parts 22 for connection that are electrically connected to electrodes to be inspected in a wafer as an object for inspection and extend in the thickness-wise direction (direction perpendicular to the paper in FIG. 15) of the film are arranged so as to align in accordance with a pattern corresponding to a pattern of the electrodes to be inspected. These conductive parts 22 for connection contain conductive particles exhibiting magnetism at high density in a state oriented so as to align in the thickness-wise direction and are mutually insulated by an insulating part 23, in which the conductive particles are not contained at all or scarcely contained.

Two conductive parts 22 for connection, which are located at the center among these conductive parts 22 for connection and adjacent to each other, are arranged with a clearance greater than a clearance between other adjacent conductive parts 22 for connection. A conductive part 26 for non-connection that is not electrically connected to any electrode to be inspected in the wafer as the object for inspection and extends in the thickness-wise direction is formed between the 2 conductive parts 22 for connection, which are located at the center and adjacent to each other. The conductive part 26 for non-connection contains the conductive particles exhibiting magnetism at high density in a state oriented so as to align in the thickness-wise direction and is mutually insulated from the conductive parts 22 for connection by an insulating part 23, in which the conductive particles are not contained at all or scarcely contained.

In the embodiment illustrated, projected parts 24 and projected parts 27 protruding from other surfaces than portions, at which the conductive parts 22 for connection and peripheries thereof are located, and portions, at which the conductive parts 26 for non-connection and peripheries thereof are located, are formed at those portions on both sides of the functional part 21 in the elastic anisotropically conductive film 20.

At the peripheral edge of the functional part 21, a supported part 25 that is fixed to and supported by the inner peripheral edge about the anisotropically conductive film-arranging hole 11 in the frame plate 10 is integrally and continuously formed with the functional part 21, and the supported part 25 contains the conductive particles.

Other specific constitutions are basically the same as those in the anisotropically conductive connector shown in FIGS. 1 to 4.

The anisotropically conductive connector shown in FIG. 14 and the anisotropically conductive connector shown in FIG. 15 can be produced in a similar manner to the process for producing the anisotropically conductive connector shown in FIGS. 1 to 4 by using a mold composed of a top force and a bottom force, on which ferromagnetic substance layers have been respectively formed in accordance with a pattern corresponding to an arrangement pattern of the conductive parts 22 for connection and conductive parts 26 for non-connection in the elastic anisotropically conductive films 20 to be formed, and non-magnetic substance layers have been formed at portions other than the ferromagnetic substance layers, in place of the mold shown in FIG. 6.

According to such a mold, a pair of, for example, electromagnets are arranged on the upper surface of a base plate in the top force and the lower surface of a base plate in the bottom force, and the electromagnets are operated, whereby in a molding material layers formed between the top force and the bottom force, conductive particles dispersed in portions to become the functional parts 21 in the molding material layers are gathered at portions to become the conductive parts 22 for connection and portions to become the conductive parts 26 for non-connection, and oriented so as to align in the thickness-wise direction of the molding material layers. On the other hand, the conductive particles located above and below the frame plate 10 in the molding material layers remain retained above and below the frame plate 10.

In this state, the molding material layers are subjected to a curing treatment, whereby the elastic anisotropically conductive films 20 each composed of the functional part 21, in which a plurality of the conductive parts 22 for connection and conductive parts 26 for non-connection containing the conductive particles in the elastic polymeric substance in a state oriented so as to align in the thickness-wise direction are arranged in a state mutually insulated by the insulating part 23 composed of the elastic polymeric substance, in which the conductive particles are not present at all or scarcely present, and the supported part 25, which is continuously and integrally formed at a peripheral edge of the functional part 21 and in which the conductive particles are contained in the elastic polymeric substance, are formed in a state that the supported part 25 has been fixed to the inner periphery about each anisotropically conductive film-arranging hole 11 of the frame plate 10, thereby producing the anisotropically conductive connector.

The conductive parts 26 for non-connection in the anisotropically conductive connector shown in FIG. 14 are obtained by applying a magnetic field to the portions to become the conductive parts 26 for non-connection in the molding material layers upon the formation of the elastic anisotropically conductive films 20 to gather the conductive particles existing between the portions located most outside in the molding material layers to become the conductive parts 22 for connection and the frame plate 10 at the portions to become the conductive parts 26 for non-connection, and subjecting the molding material layers to a curing treatment in this state. Thus, the conductive particles are prevented from being contained in excess in the portions located most outside in the molding material layers to become the conductive parts 22 for connection in the formation of the elastic anisothopically conductive films 20. Accordingly, even when the each elastic anisotropically conductive films 20 to be formed have comparatively many conductive parts 22 for connection, it is surely prevented to contain an excessive amount of the conductive particles in the conductive parts 22 for connection located most outside in the elastic anisotropically conductive film 20.

The conductive parts 26 for non-connection in the anisotropically conductive connector shown in FIG. 15 are obtained by applying a magnetic field to the portions to become the conductive parts 26 for non-connection in the molding material layers upon the formation of the elastic anisotropically conductive films 20 to gather the conductive particles existing between two adjacent portions arranged with a great clearance to become the conductive parts 22 for connection at the portion to become the conductive part for non-connection, in each molding material layer, and subjecting the molding material layer to a curing treatment in this state. Thus, the conductive particles are prevented from being contained in excess in the two adjacent portions arranged with a great clearance in each molding material layer to become the conductive parts 22 for connection in the formation of the elastic anisotropically conductive films 20. Accordingly, an excessive amount of the conductive particles can be surely prevented from being contained in these conductive parts 22 for connection even when the elastic anisotropically conductive films 20 to be formed each have at least 2 conductive parts 22 for connection arranged with a great clearance.

(2) In the anisotropically conductive connector, the projected parts 24 in the elastic anisotropically conductive films 20 are not essential, and one or both surfaces may be flat, or a recessed portion may be formed.

(3) A metal layer may be formed on the surfaces of the conductive parts 22 for connection in the elastic anisotropically conductive films 20.

(4) when a non-magnetic substance is used as a base material of the frame plate 10 in the production of the anisotropically conductive connector, a means of plating inner peripheries about the anisotropically conductive film-arranging holes 11 in the frame plate 10 with a magnetic substance or coating them with a magnetic paint to apply a magnetic field thereto, or a means of forming ferromagnetic substance layers in the mold 60 according to the supported parts 25 of the elastic anisotropically conductive films 20 to apply a magnetic field thereto may be utilized as a means for applying the magnetic field to portions to become the supported parts 25 in the molding material layers 20A.

(5) The use of the spacer is not essential in the formation of the molding material layers, and spaces for forming the elastic anisotropically conductive films may be surely retained between the top force and bottom force, and the frame plate by any other means.

(6) In the probe member, the sheet-like connector 40 is not essential, and it may have a construction such that the elastic anisotropically conductive films 20 in the anisotropically conductive connector 2 is brought into contact with a wafer as an object for inspection to achieve electrical connection.

The present invention will hereinafter be described specifically by the following examples. However, the present invention is not limited to these examples.

[Production of Wafer for Test]

Figure 16:
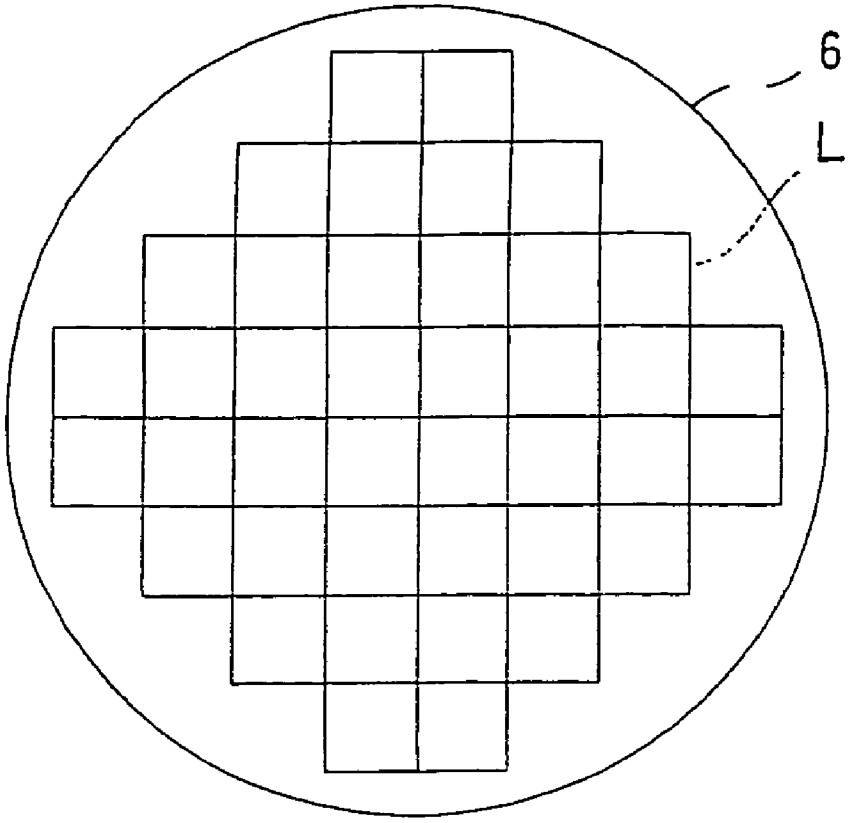
FIG. 16 is a plan view of a wafer for test used in Example.
Figure 17:
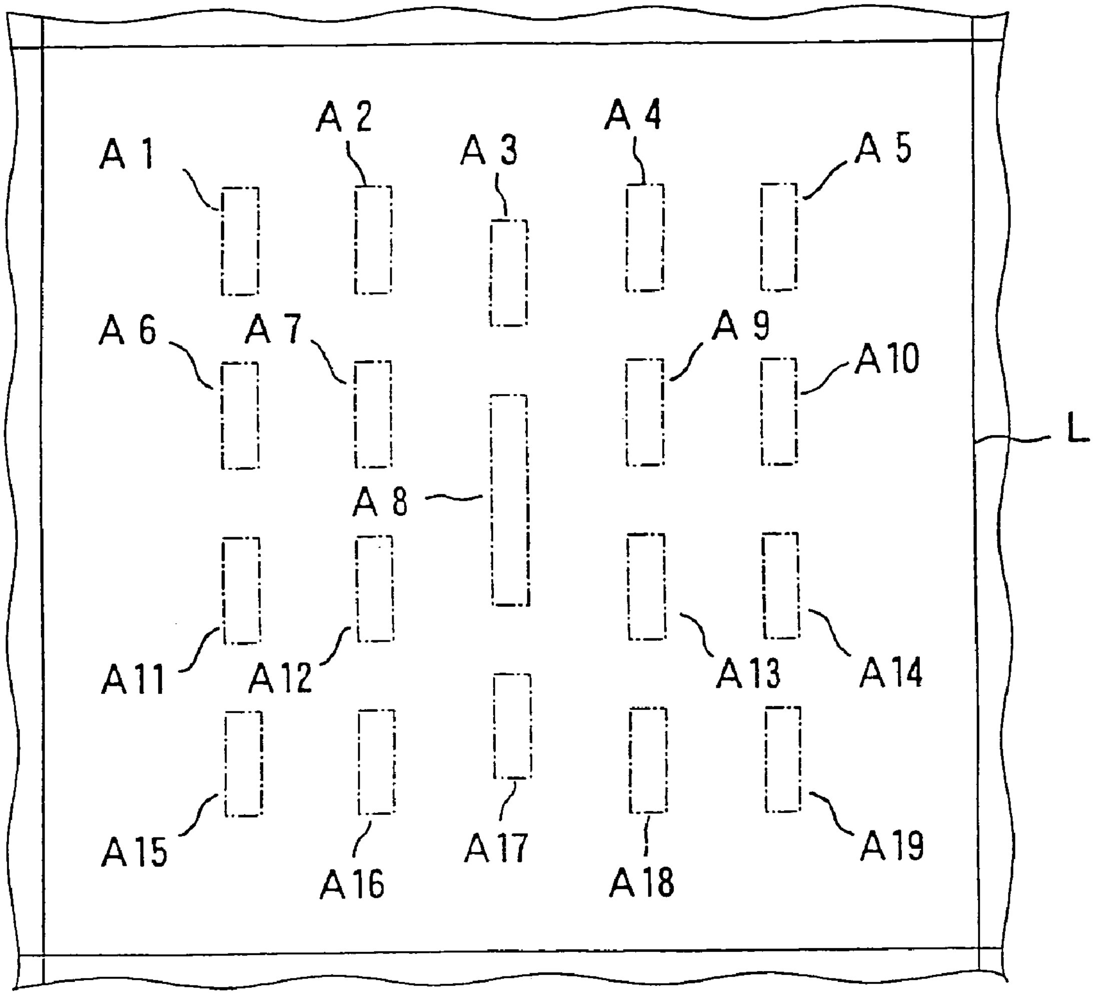
FIG. 17 illustrates regions of electrodes to be inspected in the wafer shown in FIG. 16.

As illustrated in FIG. 16, 40 square integrated circuits L in total, each of which had dimensions of 20 mm×20 mm, had been formed on a wafer 6 made of silicon (coefficient of linear thermal expansion: $3.3\times10^{-6}$/K) and having a diameter of 8 inches. Each of the integrated circuits L formed on the wafer 6 has 19 regions A1 to A19 of electrodes to be inspected in total as illustrated in FIG. 17. In each of the regions A1 to A7 and A9 to A19 of the electrodes to be inspected, are arranged 13 rectangular electrodes (not illustrated) to be inspected each having dimensions of 80 μm in a vertical direction (upper and lower direction in FIG. 17) and 200 μm in a lateral direction (left and right direction in FIG. 17) at a pitch of 120 μm in a row in the vertical direction. In the region A8 of the electrodes to be inspected, are arranged 26 rectangular electrodes (not illustrated) to be inspected each having dimensions of 80 μm in the vertical direction and 200 μm in the lateral direction at a pitch of 120 μm in a row in the vertical direction. The total number of the electrodes to be inspected in each of the integrated circuits L is 260, and the total numbers of the electrodes to be inspected in the wafer is 10,400. This wafer will hereinafter be referred to as "Wafer W for test".

EXAMPLE 1

Figure 18:
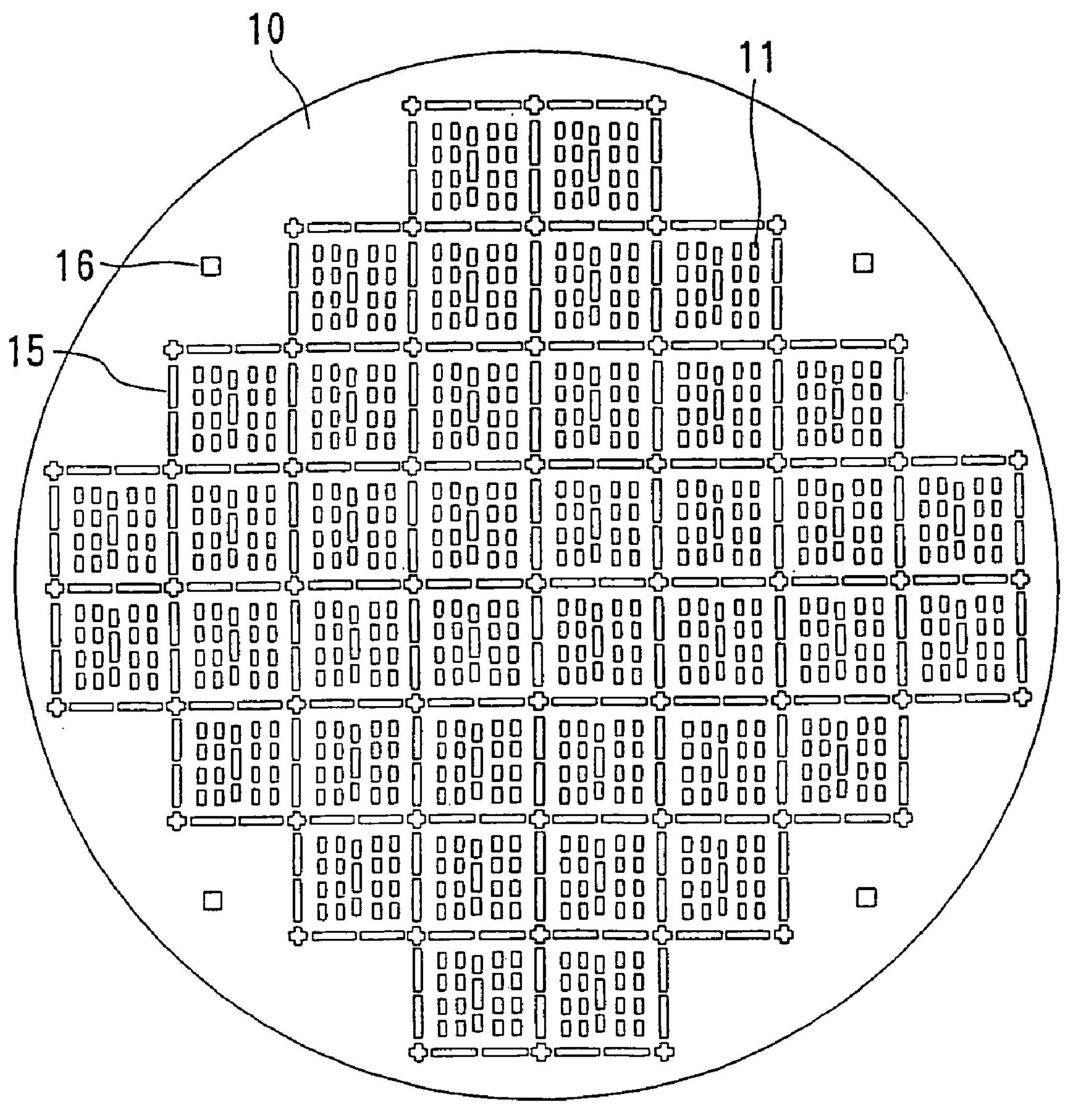
FIG. 18 is a top view of a frame plate produced in Example.
Figure 19:
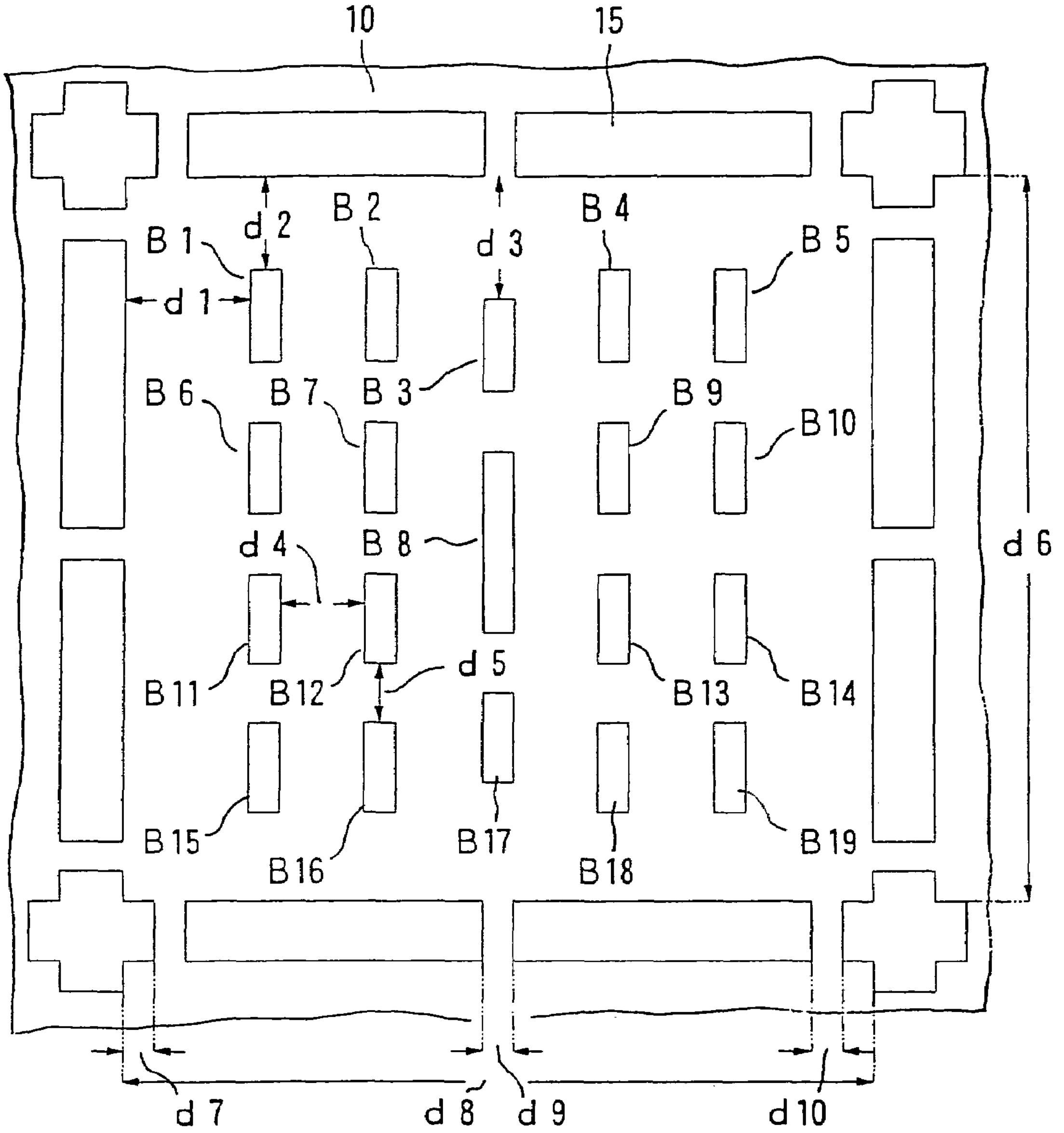
FIG. 19 illustrates, on an enlarged scale, a part of the frame plate shown in FIG. 18.
Figure 20:
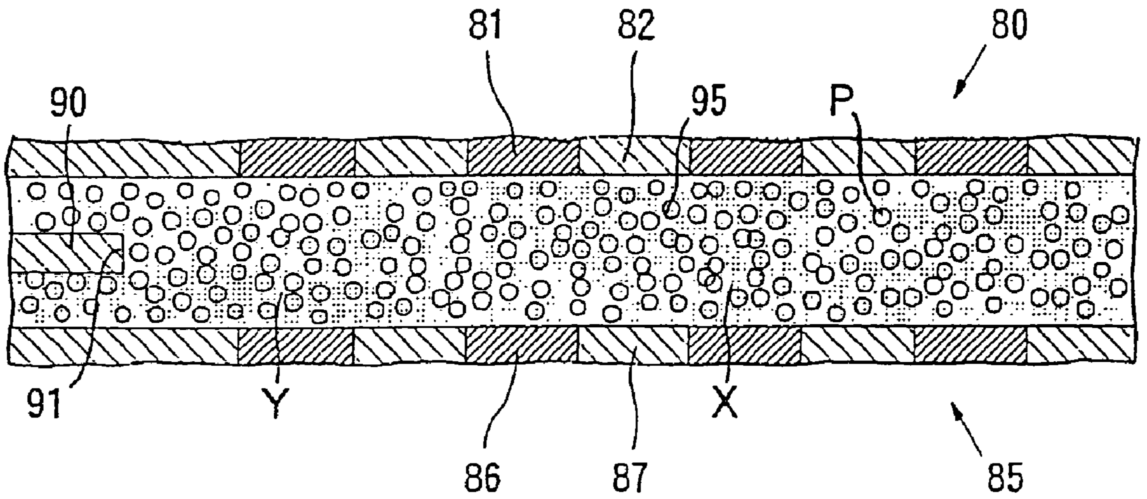
FIG. 20 PRIOR ART
FIG. 20 is a cross-sectional view illustrating a state that a frame plate has been arranged within a mold in a process for producing the conventional anisotropically conductive connector, and moreover a molding material layer has been formed.

(1) Frame Plate:

A frame plate having a diameter of 8 inches and a plurality of anisotropically conductive film-arranging holes formed according to the regions of the electrodes to be inspected in Wafer W for test described above was produced under the following conditions in accordance with the construction shown in FIGS. 18 and 19.

A material of this frame plate is covar (saturation magnetization: 1.4 Wb/$m^2$; coefficient of linear thermal expansion: $5\times10^{-6}$/K), and the thickness thereof is 60 μm.

The each of the anisotropically conductive film-arranging holes (indicated by characters B1 to B7 and B9 to B19 in FIG. 19) corresponding to the regions A1 to A7 and A9 to A19 of the electrodes to be inspected have dimensions of 1,700 μm in a vertical direction (upper and lower direction in FIG. 19) and 600 μm in a lateral direction (left and right direction in FIG. 19), and the anisotropically conductive film-arranging hole (indicated by character B8 in FIG. 19) corresponding to the region A8 of the electrodes to be inspected has dimensions of 3,260 μm in the vertical direction and 600 μm in the lateral direction.

The dimensions of rectangular air circulating holes are 1,500 μm×7,500 μm.

The dimensions of d1 to d10 shown in FIG. 19 are 2,550 μm for d1, 2,400 μm for d2, 3,620 μm for d3, 2,600 μm for d4, 2,867 μm for d5, 18,500 μm for d6, 250 μm for d7, 18,500 μm for d8, 1,000 μm for d9 and 1,000 μm for d10.

(2) Spacer:

Two spacers for molding elastic anisotropically conductive films, each of which have a plurality of through-holes formed according to the regions of the electrodes to be inspected in Wafer W for test, were produced under the following conditions.

A material of these spacers is stainless steel (SUS304), and the thickness thereof is 20 μm.

The each of the through-holes corresponding to the regions A1 to A7 and A9 to A19 of the electrodes to be inspected have dimensions of 2,500 μm in the vertical direction and 1,400 μm in the lateral direction, and the through-hole corresponding to the region A8 of the electrodes to be inspected has dimensions of 4,060 μm in the vertical direction and 1,400 μm in the lateral direction. A clearance between the through-holes adjacent in the lateral direction is 1,800 μm, and a clearance between the through-holes adjacent in the vertical direction is 1500 μm.

(3) Mold:

A mold for molding elastic anisotropically conductive films was produced under the following conditions in accordance with the construction shown in FIG. 6.

A top force and a bottom force in this mold each have a base plate made of iron and having a thickness of 6 mm. On the base plate, are arranged ferromagnetic substance layers made of nickel in accordance with a pattern corresponding to a pattern of the electrodes to be inspected in Wafer W for test. More specifically, the dimensions of each of the ferromagnetic substance layers are 60 μm (vertical direction)×200 μm (lateral direction)×100 μm (thickness). The number of regions (regions corresponding to the regions A1 to A7 and A9 to A19 of the electrodes to be inspected), in which 13 ferromagnetic substance layers have been arranged in a row in the vertical direction at a pitch of 120 μm, is 18, and the number of region (region corresponding to the region A8 of the electrodes to be inspected), in which 26 ferromagnetic substance layers have been arranged in a row in the vertical direction at a pitch of 120 μm, is 1. In the whole base plate, are formed 10,400 ferromagnetic substance layers.

Non-magnetic substance layers are formed by subjecting dry film resists to a curing treatment. The dimensions of each of recessed parts are 70 μm (vertical direction)×210 μm (lateral direction)×25 μm (deepness), and the thickness of other portions than the recessed parts is 75 μm (the thickness of the recessed parts: 50 μm).

(4) Elastic Anisotropically Conductive Film:

Elastic anisotropically conductive films were formed in the frame plate in the following manner by using the above-described frame plate, spacer and mold.

To 100 parts by weight of addition type liquid silicone rubber were added and mixed 35 parts by weight of conductive particles having an average particle diameter of 12 μm. Thereafter, the resultant mixture was subjected to a defoaming treatment by pressure reduction, thereby preparing a molding material for molding the elastic anisotropically conductive films. In the above-described process, those (average amount coated: 20% by weight of the weight of the core particles) obtained by plating core particles formed of nickel with gold were used as the conductive particles.

The molding material prepared was applied to the surfaces of the top force and bottom force of the mold by screen printing, thereby forming molding material layers in accordance with a of the elastic anisotropically conductive films to be formed, and the frame plate was superimposed in alignment on the molding surface of the bottom force through the spacer for the side of the bottom force. Further, the top force was superimposed in alignment on the frame plate through the spacer for the side of the top force.

The molding material layers formed between the top force and the bottom force were subjected to a curing treatment under conditions of 100° C. and 1 hour while applying a magnetic field of 2 T to portions located between the corresponding ferromagnetic substance layers in the thickness-wise direction by electromagnets, thereby forming an elastic anisotropically conductive film in each of the anisotropically conductive film-arranging holes of the frame plate, thus producing an anisotropically conductive connector. This anisotropically conductive connector will hereinafter be referred to as "Anisotropically Conductive Connector C1".

The elastic anisotropically conductive films thus obtained will be described specifically. Each of the elastic anisotropically conductive films corresponding to the regions A1 to A7 and A9 to A19 of the electrodes to be inspected in Wafer W for test has dimensions of 2,500 μm in the vertical direction and 1,400 μm in the lateral direction. In a functional part in each of the elastic anisotropically conductive films, are arranged 13 conductive parts for connection in a line in a vertical direction at a pitch of 120 μm. The conductive parts for connection each have dimensions of 60 μm in the vertical direction and 200 μm in the lateral direction, and the thickness thereof is 150 μm. The thickness of each insulating part in the functional part is 100 μm. The thickness (thickness of one of the forked portion) of the supported part in each of the elastic anisotropically conductive films is 20 μm.

On the other hand, the elastic anisotropically conductive film corresponding to the region A8 of the electrodes to be inspected in Wafer W for test has dimensions of 4,060 μm in the vertical direction and 1,400 μm in the lateral direction. In a functional part in each of the elastic anisotropically conductive films, are arranged 26 conductive parts for connection in a line in a vertical direction at a pitch of 120 μm. The conductive parts for connection each have dimensions of 60 μm in the vertical direction and 200 μm in the lateral direction, and the thickness thereof is 150 μm. The thickness of each insulating part in the functional part is 100 μm. The thickness (thickness of one of the forked portion) of the supported part in each of the elastic anisotropically conductive films is 20 μm.

The proportion of the content of the conductive particles in the conductive parts for connection in each of the elastic anisotropically conductive films of Anisotropically Conductive Connector C1 thus obtained was investigated. As a result, the content was about 30% in terms of a volume fraction in all the conductive parts for connection.

The supported parts and the insulating parts in the functional parts of the elastic anisotropically conductive films were observed. As a result, it was confirmed that the conductive particles are present in the supported parts and that the conductive particles are scarcely present in the insulating parts in the functional parts.

(5) Circuit Board for Inspection:

Alumina ceramic (coefficient of linear thermal expansion: $4.8\times10^{-6}$/K) was used as a base material to produce a circuit board for inspection, in which inspection electrodes had been formed in accordance with a pattern corresponding to the pattern of the electrodes to be inspected in Wafer W for test. This circuit board for inspection has dimensions of 30 cm×30 cm as a whole and is rectangular shape. The each of the inspection electrodes thereof has dimensions of 60 μm in the vertical direction and 200 μm in the lateral direction. This circuit board for inspection will hereinafter be referred to as "Inspection Circuit Board T".

(6) Sheet-Like Connector:

A laminate material obtained by laminating a copper layer having a thickness of 15 μm on one surface of an insulating sheet formed of polyimide and having a thickness of 20 μm was provided, and 10,400 through-holes each extending through in the thickness-wise direction of the insulating sheet and having a diameter of 30 μm were formed in the insulating sheet of the laminate material in accordance with a pattern corresponding to the pattern of electrodes to be inspected in Wafer W for test by subjecting the insulating sheet to laser machining. This laminate material was then subjected to photolithography and plating treatment with nickel, whereby short circuit parts integrally connected to the copper layer were formed in the through-holes in the insulating sheet, and at the same time, projected front-surface electrode parts integrally connected to the respective short circuit parts were formed on the front surface of the insulating sheet. The diameter of the front-surface electrode parts was 40 μm, and the height from the surface of the insulating sheet was 20 μm. Thereafter, the copper layer of the laminate material was subjected to a photo-etching treatment to remove a part thereof, thereby forming rectangular back-surface electrode parts having dimensions of 70 μm×210 μm. Further, the front-surface electrode parts and back-surface electrode parts were subjected to a plating treatment with gold, thereby forming electrode structures, thus producing a sheet-like connector. This sheet-like connector will hereinafter be referred to as "Sheet-like Connector M".

(7) Test 1:

An electrode plate composed of circular copper having a thickness of 2 mm and a diameter of 8 inches was arranged on a test table equipped with an electric heater, and Anisotropically Conductive Connector C1 was arranged on this electrode plate. Inspection Circuit Board T was then aligned and fixed on to this Anisotropically Conductive Connector C1 in alignment in such a manner that the inspection electrodes thereof are located on the respective conductive parts for connection of Anisotropically Conductive Connector C1. Further, Inspection Circuit Board T was pressurized downward under a load of 100 kg.

One inspection electrode was selected from among 10,400 inspection electrodes in Inspection Circuit Board T at room temperature (25° C.), and an electric resistance between the selected inspection electrode and any other inspection electrode was successively measured to record a half of the electric resistance value measured as an electric resistance (hereinafter referred to as "conduction resistance") between conductive parts for connection in Anisotropically Conductive Connector C1 and to count the number of conductive parts for connection that the conduction resistance was 2 Ω or higher. Those that the conduction resistance between conductive parts for connection is 2 Ω or higher are difficult to be actually used in electrical inspection as to integrated circuits formed on a wafer.

After the test table was heated to 120° C. and left to stand for 1 hour in this state, an conduction resistance between conductive parts for connection in Anisotropically Conductive Connector C1 was measured in the same manner as described above to count the number of conductive parts for connection that the conduction resistance was 2 Ω or higher.

The results are shown in the following Table 1.

(8) Test 2:

Wafer W for test was arranged on a test table equipped with an electric heater, and Anisotropically Conductive Connector C1 was arranged on this Wafer W for test in alignment in such a manner that the conductive parts for connection thereof are located on the respective electrodes to be inspected of Wafer W for test. Inspection Circuit Board T was then aligned and fixed on to this Anisotropically Conductive Connector C1 in alignment in such a manner that the inspection electrodes thereof are located on the respective conductive parts for connection of Anisotropically Conductive Connector C1. Further, the circuit board for inspection was pressurized downward under a load of 100 kg.

Voltage was then successively applied to the respective inspection electrodes in the circuit board for inspection at room temperature (25° C.), and an electric resistance between an inspection electrode, to which the voltage had been applied, and any other inspection electrode was measured as an electric resistance (hereinafter referred to as "insulation resistance") between conductive parts for connection in Anisotropically Conductive Connector C1 to count the number of conductive parts for connection that the insulation resistance was 10 MΩ or lower. Those that the insulation resistance between conductive parts for connection is 10 MΩ or lower are difficult to be actually used in electrical inspection as to integrated circuits formed on a wafer.

After the test table was heated to 120° C. and left to stand for 1 hour in this state, an insulation resistance between conductive parts for connection in Anisotropically Conductive Connector C1 was measured in the same manner as described above to count the number of conductive parts for connection that the insulation resistance was 10 MΩ or lower.

The results are shown in the following Table 1.

(9) Test 3:

An electrode plate composed of circular copper having a thickness of 2 mm and a diameter of 8 inches was arranged on a test table equipped with an electric heater. Sheet-like Connector M was arranged on the electrode plate so as to bring the front-surface electrode parts thereof into contact with the electrode plate. Anisotropically Conductive Connector C1 was arranged on this sheet-like connector in alignment in such a manner that the conductive parts for connection thereof are located on the respective back-surface electrode parts in Sheet-like Connector M. Inspection Circuit Board T was fixed on to this anisotropically conductive connector in alignment in such a manner that the each of the inspection electrodes thereof are located on the respective conductive parts for connection of Anisotropically Conductive Connector C1. Further, Inspection Circuit Board T was pressurized downward under a load of 100 kg.

A conduction resistance between conductive parts for connection in Anisotropically Conductive Connector C1 was measured at room temperature (25° C.) and in a state that the test table was heated to 120° C. in the same manner as in (7) Test 1 to count the number of conductive parts for connection that the conduction resistance was 2 Ω or higher.

The results are shown in the following Table 1.

(10) Test 4:

An electrode plate composed of circular copper having a thickness of 2 mm and a diameter of 8 inches was arranged on a test table equipped with an electric heater. Sheet-like Connector M was arranged on the electrode plate so as to bring the front-surface electrode parts thereof into contact with the electrode plate. Anisotropically Conductive Connector C1 was arranged on this sheet-like connector in alignment in such a manner that the conductive parts for connection thereof are located on the respective back-surface electrode parts in Sheet-like Connector M. Inspection Circuit Board T was fixed on to this anisotropically conductive connector in alignment in such a manner that the inspection electrodes thereof are located on the respective conductive parts for connection of Anisotropically Conductive Connector C1. Further, Inspection Circuit Board T was pressurized downward under a load of 100 kg.

An insulation resistance between conductive parts for connection in Anisotropically Conductive Connector C1 was measured in the same manner as in (8) test 2, except that Sheet-like Connector M was arranged between Wafer W for test and Anisotropically Conductive Connector C1 as in (9) Test 3 to count the number of conductive parts for connection that the insulation resistance was 10 MΩ or lower.

The results are shown in the following Table 1.

(11) Test 5:

A circular box-type chamber opened at the top thereof, which had an internal diameter of 230 mm and a depth of 2.2 mm, was produced. An evacuation pipe was provided in a sidewall of this chamber, and an O-ring having elasticity was arranged on the upper end surface of the sidewall.

An electrode plate composed of circular copper having a thickness of 2 mm and a diameter of 8 inches was arranged in this chamber. Sheet-like Connector M was then arranged on the electrode plate so as to bring the front-surface electrode parts thereof into contact with the electrode plate. Anisotropically Conductive Connector C1 was arranged on this sheet-like connector in alignment in such a manner that the conductive parts for connection thereof are located on the respective back-surface electrode parts in Sheet-like Connector M, and Inspection Circuit Board T was arranged on to this anisotropically conductive connector in alignment in such a manner that the inspection electrodes thereof are located on the respective conductive parts for connection of Anisotropically Conductive Connector C1. Further, a pressing plate was arranged on and fixed to Inspection Circuit Board T. In this state, the electrode plate, Sheet-like Connector M and Anisotropically Conductive Connector C1 were housed in the chamber, the opening of the chamber was closed by Inspection Circuit Board T through the O-ring, and the electrode plate and Sheet-like Connector M, Sheet-like Connector M and Anisotropically Conductive Connector C1, and Anisotropically Conductive Connector C1 and circuit board for inspection were adjusted by the pressing plate so as to be brought into contact with each other or into contact under slight pressure with each other.

Air within the chamber was evacuated at room temperature (25° C.) through the evacuation pipe by means of a vacuum pump to reduce the pressure within the chamber to 1,000 Pa. One inspection electrode was then selected from among 10,400 inspection electrodes in Inspection Circuit Board T, and an electric resistance between the selected inspection electrode and any other inspection electrode was successively measured to record a half of the electric resistance value measured as a conduction resistance between conductive parts for connection in Anisotropically Conductive Connector C1 and to count the number of conductive parts for connection that the conduction resistance was 2 Ω or higher.

After completion of the above-described process, Inspection Circuit Board T, Anisotropically Conductive Connector C1 and Sheet-like Connector M were removed from the chamber to conduct the above-described process again, thereby counting the number of conductive parts for connection that the conduction resistance was 2 Ω or higher.

The results are shown in the following Table 1.

Comparative Example 1

An anisotropically conductive connector was produced in the same manner as in Example 1 except that the material of the frame plate was changed from covar to a stainless steel (SUS304, saturation magnetization: 0.01 $Wb/m^2$; coefficient of linear thermal expansion: $1.7\times10^{-5}$/K). This anisotropically conductive connector will hereinafter be referred to as "Anisotropically Conductive Connector C2".

The supported parts (25) and the insulating parts (23) in the functional parts (21) of the elastic anisotropically conductive films (20) in Anisotropically Conductive Connector C2 were observed. As a result, it was confirmed that the conductive particles are scarcely present in the supported parts (25) and that the conductive particles are present in the insulating parts (23) in the functional parts (21).

Test 1 and Test 2 in Example 1 were performed in the same manner as in Example 1 except that Anisotropically Conductive Connector C2 was used in place of Anisotropically Conductive Connector C1.

The results are shown in the following Table 1.

Comparative Example 2

A mold of the same construction as the mold produced in Example 1 except that no recessed parts were formed in the non-magnetic substance layers in the bottom force was produced, and a spacer having a thickness of 100 μm, a diameter of 8 inches and circular through-holes and composed of stainless steel (SUS304) was produced.

To 100 parts by weight of addition type liquid silicone rubber were added and mixed 35 parts by weight of conductive particles having an average particle diameter of 12 μm. Thereafter, the resultant mixture was subjected to a defoaming treatment by pressure reduction, thereby preparing a molding material for molding the elastic anisotropically conductive films. In the above-described process, those (average amount coated: 20% by weight of the weight of the core particles) obtained by plating core particles formed of nickel with gold were used as the conductive particles.

The spacer described above was arranged on the molding surface of the bottom force in the mold, the molding material was filled into the through-holes in the spacer to form molding material layers, and the top force was further superimposed in alignment on the molding material layers and the spacer.

The molding material layers formed between the top force and the bottom force were subjected to a curing treatment under conditions of 100° C. and 1 hour while applying a magnetic field of 2 T to portions located between the corresponding ferromagnetic substance layers in the thickness-wise direction by electromagnets, thereby producing an anisotropically conductive sheet. This anisotropically conductive sheet will hereinafter be referred to as "Anisotropically Conductive Sheet S".

Anisotropically Conductive Sheet S will be described specifically. Thirteen conductive parts for connection were arranged in a line in the vertical direction at a pitch of 120 μm in each of regions corresponding to the regions A1 to A7 and A9 to A19 of the electrodes to be inspected in Wafer W for test. The conductive parts for connection each have dimensions of 60 μm in the vertical direction and 200 μm in the lateral direction, and the thickness thereof is 150 μm. On the other hand, 26 conductive parts for connection are arranged in a line in the vertical direction at a pitch of 120 μm in a region corresponding to the region A8 of the electrodes to be inspected in Wafer W for test. The conductive parts for connection each have dimensions of 60 μm in the vertical direction and 200 μm in the lateral direction, and the thickness thereof is 150 μm. The thickness of each insulating part is 100 μm.

Anisotropically Conductive Sheet S thus obtained was observed. As a result, it was confirmed that the conductive particles are present in the insulating parts.

A heat-resistant adhesive was applied to other regions than the inspection electrodes on the surface of Inspection Circuit Board T, and Anisotropically Conductive Sheet S was arranged on this Inspection Circuit Board T in alignment in such a manner that the conductive parts for connection thereof are located on the respective inspection electrodes of Inspection Circuit Board T to integrally bond Anisotropically Conductive Sheet S to Inspection Circuit Board T, thereby producing a probe member.

Test 1 and Test 2 in Example 1 were performed in the same manner as in Example 1 except that the probe member described above was used in place of Anisotropically Conductive Connector C1 and Inspection Circuit Board T.

The results are shown in the following Table 1.

Comparative Example 3

A frame plate having a thickness of 60 μm and a diameter of 8 inches and circular anisotropically conductive film-arranging holes and made of covar was produced, and two spacers each having a thickness of 20 μm, a diameter of 8.5 inches and circular through-holes and made of stainless steel (SUS304) were produced.

To 100 parts by weight of addition type liquid silicone rubber were added and mixed 35 parts by weight of conductive particles having an average particle diameter of 12 μm. Thereafter, the resultant mixture was subjected to a defoaming treatment by pressure reduction, thereby preparing a molding material for molding elastic anisotropically conductive films. In the above-described process, those (average amount coated: 20% by weight of the weight of the core particles) obtained by plating core particles formed of nickel with gold were used as the conductive particles.

The molding material prepared was applied to the surfaces of the top force and bottom force of the mold used in Example 1, thereby forming molding material layers, and the frame plate was superimposed in alignment on the molding surface of the bottom force through the spacer for the side of the bottom force. Further, the top force was superimposed in alignment on the frame plate through the spacer for the side of the top force.

The molding material layers formed between the top force and the bottom force were subjected to a curing treatment under conditions of 100° C. and 1 hour while applying a magnetic field of 2 T to portions located between the corresponding ferromagnetic substance layers in the thickness-wise direction by electromagnets, thereby forming an elastic anisotropically conductive film in each of the anisotropically conductive film-arranging holes of the frame plate, thus producing an anisotropically conductive connector. This anisotropically conductive connector will hereinafter be referred to as "Anisotropically Conductive Connector C31".

The elastic anisotropically conductive films thus obtained will be described specifically. Thirteen conductive parts for connection were arranged in a line in the vertical direction at a pitch of 120 μm in each of regions corresponding to the regions A1 to A7 and A9 to A19 of the electrodes to be inspected in Wafer W for test. The conductive parts for connection each have dimensions of 60 μm in the vertical direction and 200 μm in the lateral direction, and the thickness thereof is 150 μm. On the other hand, 26 conductive parts for connection are arranged in a line in the vertical direction at a pitch of 120 μm in a region corresponding to the region A8 of the electrodes to be inspected in Wafer W for test. The conductive parts for connection each have dimensions of 60 μm in the vertical direction and 200 μm in the lateral direction, and the thickness thereof is 150 μm. The thickness of each insulating part in the functional part is 100 μm. The thickness (thickness of one of the forked portion) of the supported part is 20 μm.

The elastic anisotropically conductive films in Anisotropically Conductive Connector C3 thus obtained were observed. As a result, it was confirmed that the conductive particles are present in the insulating parts in the functional parts.

Test 1, Test 2 and Test 5 in Example 1 were performed in the same manner as in Example 1 except that Anisotropically Conductive Connector C3 was used in place of Anisotropically Conductive Connector C1.

plate and the conductive parts for connection adjacent thereto can be achieved with certainty.

Since each of the anisotropically conductive film-arranging holes in the frame plate is formed corresponding to an electrode region in which electrodes to be inspected have been formed in each of integrated circuits in a wafer as an object for inspection, and the elastic anisotropically conductive film arranged in the each of the anisotropically conductive film-arranging hole may be small in area, the individual elastic anisotropically conductive films are easy to be formed. In addition, since the elastic anisotropically conductive film small in area is little in the absolute quantity of thermal expansion in a plane direction of the elastic anisotropically conductive film even when it is subjected to thermal hysteresis, the thermal expansion of the elastic anisotropically conductive film in the plane direction is surely restrained by the frame plate by using a material having a low coefficient of linear thermal expansion as that for forming the frame plate. Accordingly, a good electrically connected state can be stably retained even when the WLBI test is performed on a large-area wafer.

TABLE 1

| | Test 1 (the number of conductive parts for connection that the conduction resistance is 2Ω or higher | | Test 2 (the number of conductive parts for connection that the insulation resistance is 10 MΩ or lower | | Test 3 (the number of conductive parts for connection that the conduction resistance is 2Ω or higher | | Test 4 (the number of conductive parts for connection that the insulation resistance is 10 MΩ or lower | | Test 5 (the number of conductive parts for connection that the conduction resistance is 2Ω or higher | |
|---|---|---|---|---|---|---|---|---|---|---|
| | 25° C. | 120° C. | 25° C. | 120° C. | 25° C. | 120° C. | 25° C. | 120° C. | First time | Second time |
| Example 1 | 0 | 0 | 0 | 0 | 0 | 0 | 0 | 0 | 0 | 0 |
| Comparative Example 1 | 5 | 115 | 98 | 167 | — | — | — | — | — | — |
| Comparative Example 2 | 55 | 118 | 414 | 923 | — | — | — | — | — | — |
| Comparative Example 3 | 1634 | 4597 | 1845 | 5126 | — | — | — | — | 2934 | 3256 |

As apparent from the results in Table 1, it was confirmed that according to the anisotropically conductive connector of Example 1, good conductivity is achieved in the conductive parts for connection and necessary insulating property is achieved between adjacent conductive parts for connection in the elastic anisotropically conductive films even when the pitch among the conductive parts for connection is small, and a good electrically connected state is stably retained even by environmental changes such as thermal hysteresis by temperature change.

EFFECTS OF THE INVENTION

Since the anisotropically conductive connectors according to the present invention are obtained by subjecting the molding material layers to a curing treatment in a state that the conductive particles have been retained in portions to become the supported parts in the molding material layers by applying a magnetic field to those portions in the formation of the elastic anisotropically conductive films, the conductive particles existing in the portions to become the supported parts in the molding material layers, i.e., portions located above and below the inner peripheries about the anisotropically conductive film-arranging holes in the frame plate are not gathered at the portions to become the conductive parts for connection, so that the conductive particles are prevented from being contained in excess in the conductive parts for connection in the resulting anisotropically conductive films, particularly, the conductive parts for connection located most outside. Accordingly, there is no need of reducing the content of the conductive particles in the molding material layers, so that good conductivity is achieved with certainty in all the conductive parts for connection in the elastic anisotropically conductive films, and moreover sufficient insulating property between adjacent conductive parts for connection and between the frame The positioning holes are formed in the frame plate, whereby positioning to the wafer as the object for inspection or the circuit board for inspection can be easily conducted.

The air circulating holes are formed in the frame plate, whereby air existing between the anisotropically conductive connector and the circuit board for inspection is discharged through the air circulating holes of the frame plate at the time the pressure within a chamber is reduced when that by the pressure reducing system is utilized as the means for pressing the probe member in an inspection apparatus for wafer, thereby being able to surely bring the anisotropically conductive connector into close contact with the circuit board for inspection, so that necessary electrical connection can be achieved with certainty.

At least one conductive part for non-connection that is not electrically connected to any electrode to be inspected in the wafer as the object for inspection and extends in the thickness-wise direction is formed in the functional part in the elastic anisotropically conductive film, whereby an excessive amount of the conductive particles can be surely prevented from being contained in all the conductive parts for connection even when the elastic anisotropically conductive film has comparatively many conductive parts for connection, or it has at least 2 conductive parts for connection arranged with a great clearance between them.

According to the production process of the present invention, there can be advantageously produced an anisotropically conductive connector, by which positioning, and holding and fixing to a wafer as an object for inspection can be conducted with ease even when the wafer has a large area, and the pitch of electrodes to be inspected is small, and moreover good conductivity can be achieved with certainty as to all the conductive parts for connection, and insulating property between adjacent conductive parts can be achieved with certainty.

According to the probe member of the present invention, positioning, and holding and fixing to a wafer as an object for inspection can be conducted with ease even when the wafer has a large area, and the pitch of electrodes to be inspected is small, and high reliability on connection to each electrode to be inspected can be achieved because the probe member has the anisotropically conductive connector of the above.

The invention claimed is:

1. An anisotropically conductive connector, comprising:

a frame plate comprising a plurality of anisotropically conductive film-arranging holes, each extending in a thickness-wise direction of the frame plate, corresponding to electrode regions comprising electrodes to be inspected of integrated circuits in a wafer as an object for inspection, and a plurality of elastic anisotropically conductive films arranged in the respective anisotropically conductive film-arranging holes in said frame plate, each supported by the inner peripheral edge about the anisotropically conductive film-arranging hole, wherein each of the elastic anisotropically conductive films comprises a functional part comprising a plurality of conductive parts for connection, each containing conductive particles exhibiting magnetism at high density and extending in the thickness-wise direction of the film and arranged correspondingly to the electrodes to be inspected of the integrated circuits in the wafer, an insulating part insulating said conductive parts for connection mutually, and a supported part integrally arranged at a peripheral edge of the functional part and fixed to the inner peripheral edge about the anisotropically conductive film-arranging hole in said frame plate, and the supported part contains the conductive particles exhibiting magnetism, wherein said anisotropically conductive connector is suitable for conducting electrical inspection of each of a plurality of said integrated circuits in said wafer; and wherein said frame plate comprises air circulating holes each extending in the thickness-wise direction of the frame plate.

2. The anisotropically conductive connector according to claim 1, wherein said frame plate comprises positioning holes each extending in the thickness-wise direction of the frame plate.

3. The anisotropically conductive connector according to claim 1, wherein the coefficient of linear thermal expansion of the frame plate is at most $3\times10^{-5}$/K.

4. The anisotropically conductive connector according to claim 1, wherein one or both surfaces of said connector are flat.

5. The anisotropically conductive connector according to claim 1, wherein a metal layer is on the surfaces of the conductive parts for connection in the elastic anisotropically conductive films.

6. A probe member, comprising:

a circuit board for inspection, on the surface of which inspection electrodes are arranged in accordance with a pattern corresponding to a pattern of electrodes to be inspected of integrated circuits in a wafer as an object for inspection, and the anisotropically conductive connector according to claim 1 arranged on the surface of the circuit board for inspection, wherein said probe member is suitable for conducting electrical inspection of each of a plurality of integrated circuits on a wafer.

7. The probe member according to claim 6, wherein a connector in the form of a sheet is arranged on the anisotropically conductive connector, wherein the connector in the form of a sheet comprises an insulating sheet, and a plurality of electrode structures, each extending in a thickness-wise direction of the insulating sheet and arranged in accordance with a pattern corresponding to the pattern of the electrodes to be inspected.

8. An inspection apparatus, comprising:

the probe member according to claim 6, wherein an electric connection to an integrated circuit arranged on a wafer as an object for inspection is achieved through the probe member, wherein said inspection apparatus is suitable for performing electrical inspection of each of a plurality of integrated circuits on the wafer.

9. An inspection apparatus, comprising:

the probe member according to claim 7, wherein an electric connection to an integrated circuit arranged on a wafer as an object for inspection is achieved through the probe member, wherein said inspection apparatus is suitable for performing electrical inspection of each of a plurality of integrated circuits on the wafer.

10. An anisotropically conductive connector, comprising:

a frame plate comprising a plurality of anisotropically conductive film-arranging holes, each extending in a thickness-wise direction of the frame plate, corresponding to electrode regions comprising electrodes to be inspected of integrated circuits in a wafer as an object for inspection, and a plurality of elastic anisotropically conductive films arranged in the respective anisotropically conductive film-arranging holes in said frame plate, each supported by the inner peripheral edge about the anisotropically conductive film-arranging hole, wherein each of the elastic anisotropically conductive films comprises a functional part comprising a plurality of conductive parts for connection, each containing conductive particles exhibiting magnetism at high density and extending in the thickness-wise direction of the film and arranged correspondingly to the electrodes to be inspected of the integrated circuits in the wafer, an insulating part insulating said conductive parts for connection mutually, and a supported part integrally arranged at a peripheral edge of the functional part and fixed to the inner peripheral edge about the anisotropically conductive film-arranging hole in said frame plate, and the supported part contains the conductive particles exhibiting magnetism, wherein said anisotropically conductive connector is suitable for conducting electrical inspection of each of a plurality of said integrated circuits in said wafer; and wherein the coefficient of linear thermal expansion of the frame plate is at most $3\times10^{-5}$/K.

11. The anisotropically conductive connector according to claim 10, wherein said frame plate comprises positioning holes each extending in the thickness-wise direction of the frame plate.

12. The anisotropically conductive connector according to claim 10, wherein said frame plate comprises air circulating holes each extending in the thickness-wise direction of the frame plate.

13. The anisotropically conductive connector according to claim 10, wherein one or both surfaces of said connector are flat.

14. The anisotropically conductive connector according to claim 10, wherein a metal layer is on the surfaces of the conductive parts for connection in the elastic anisotropically conductive films.

15. A probe member, comprising:

a circuit board for inspection, on the surface of which inspection electrodes are arranged in accordance with a pattern corresponding to a pattern of electrodes to be inspected of integrated circuits in a wafer as an object for inspection, and the anisotropically conductive connector according to claim 10 arranged on the surface of the circuit board for inspection, wherein said probe member is suitable for conducting electrical inspection of each of a plurality of integrated circuits on a wafer.

16. The probe member according to claim 15, wherein a connector in the form of a sheet is arranged on the anisotropically conductive connector, wherein the connector in the form of a sheet comprises an insulating sheet, and a plurality of electrode structures, each extending in a thickness-wise direction of the insulating sheet and arranged in accordance with a pattern corresponding to the pattern of the electrodes to be inspected.

17. An inspection apparatus, comprising:

the probe member according to claim 15, wherein an electric connection to an integrated circuit arranged on a wafer as an object for inspection is achieved through the probe member, wherein said inspection apparatus is suitable for performing electrical inspection of each of a plurality of integrated circuits on the wafer.

18. An inspection apparatus, comprising:

the probe member according to claim 17, wherein an electric connection to an integrated circuit arranged on a wafer as an object for inspection is achieved through the probe member, wherein said inspection apparatus is suitable for performing electrical inspection of each of a plurality of integrated circuits on the wafer.

* * * * *